United States Patent [19]
Ohuchi et al.

[11] Patent Number: 5,831,903
[45] Date of Patent: *Nov. 3, 1998

[54] ELECTRICALLY ERASABLE PROGRAMMABLE READ-ONLY MEMORY WITH THRESHOLD VALUE CONTROLLER FOR DATA PROGRAMMING AND METHOD OF PROGRAMMING THE SAME

[75] Inventors: Kazunori Ohuchi; Tomoharu Tanaka; Yoshihisa Iwata, all of Yokohama; Yasuo Itoh, Kawasaki; Masaki Momodomi; Fujio Masuoka, both of Yokohama, all of Japan

[73] Assignee: Kabushiki Kaisha Toshiba, Kawasaki, Japan

[ * ] Notice: The term of this patent shall not extend beyond the expiration date of Pat. No. 5,357,612.

[21] Appl. No.: 868,138

[22] Filed: Jun. 3, 1997

Related U.S. Application Data

[63] Continuation of Ser. No. 376,665, Jan. 23, 1995, Pat. No. 5,657,270, which is a continuation of Ser. No. 145,308, Nov. 3, 1993, abandoned, which is a continuation of Ser. No. 677,762, Mar. 29, 1991, abandoned.

[30] Foreign Application Priority Data

Mar. 31, 1990 [JP] Japan ...................................... 2-82947
Sep. 25, 1990 [JP] Japan .................................... 2-251712

[51] Int. Cl.$^6$ ................................................. G11C 16/06
[52] U.S. Cl. ............................... 365/185.22; 365/185.21; 365/185.17; 365/185.18; 365/185.12
[58] Field of Search ........................ 365/185.22, 185.21, 365/185.17, 185.18, 185.12

[56] References Cited

U.S. PATENT DOCUMENTS

| | | | |
|---|---|---|---|
| 4,677,590 | 6/1987 | Arakawa | 365/185.21 |
| 4,939,690 | 7/1990 | Momodomi et al. | 365/185.17 |
| 4,959,812 | 9/1990 | Momodomi et al. | 365/185 |
| 4,980,861 | 12/1990 | Herdt et al. | 365/104 X |
| 4,996,669 | 2/1991 | Endoh et al. | 365/185.17 |
| 5,172,338 | 12/1992 | Mehrotra et al. | 365/185.03 |
| 5,357,462 | 10/1994 | Tanaka et al. | 365/185.22 |
| 5,361,227 | 11/1994 | Tanaka et al. | 365/185.22 |

FOREIGN PATENT DOCUMENTS

| | | |
|---|---|---|
| 3637682 | 5/1987 | Germany . |
| 3831538 | 3/1989 | Germany . |
| 62-188100 | 8/1987 | Japan . |

OTHER PUBLICATIONS

"Bipolar/Mos Memories Data Book", Advanced Micro Devices, ISSN 0888–4714, pp. 6–1–6–14, 1986.
SEEQ Data Book 1988/89, SEEQ Technology, Inc., pp. 3–1–3–7.

(List continued on next page.)

*Primary Examiner*—David C. Nelms
*Assistant Examiner*—Andrew Q. Tran
*Attorney, Agent, or Firm*—Oblon, Spivak, McClelland, Maier & Neustadt, P.C.

[57] ABSTRACT

A NAND cell type electrically erasable programmable read-only memory has a memory array section containing NAND cell units. Each NAND cell unit has a series array of floating gate type metal-oxide semiconductor field effect transistors as memory cell transistors. The memory section is associated with a control-gate controller, a data-latch circuit, a sense amplifier section, and a data comparator, which is connected via an output buffer to a verify-termination detector. When a data is once written into a selected memory cell in a data programming mode, a specific basing voltage is applied to the selected cell so that the actual electrical data write condition of the selected memory cell is verified. If the comparator detects that the verified write condition is dissatisfied, data-rewriting operations are repeatedly executed by additionally supplied the selected cell with a suitable voltage which compensates for the dissatisfaction of the verified write condition in the selected memory cell transistor.

19 Claims, 16 Drawing Sheets

OTHER PUBLICATIONS

Kynett et al., "An In–System Reprogrammable 32K×8 CMOS Flash Memory", IEEE Journal of Solid–State Circuits, vol. 23, No. 5, Oct. 1988, 1157–1163.

IBM Technical Disclosure Bulletin, vol. 29, No. 9, Feb. 1987, pp. 4145 and 4146, "EPROM Programming Device".

IEEE, J. Solid–State Circuits, vol. 24, pp. 1259–1263, Oct. 1989. V. Kynett et al., "A 90–ns One–Million Erase/Program Cycle 1–Mbit Flash Memory".

T. Tanaka et al., "A 4–Mbit NAND–EEPROM with Tight Programmed Vt Distribution," in 1990 Symposium on VLSI Circuits Digest of Technical Papers, pp. 105–106, Jun. 1990.

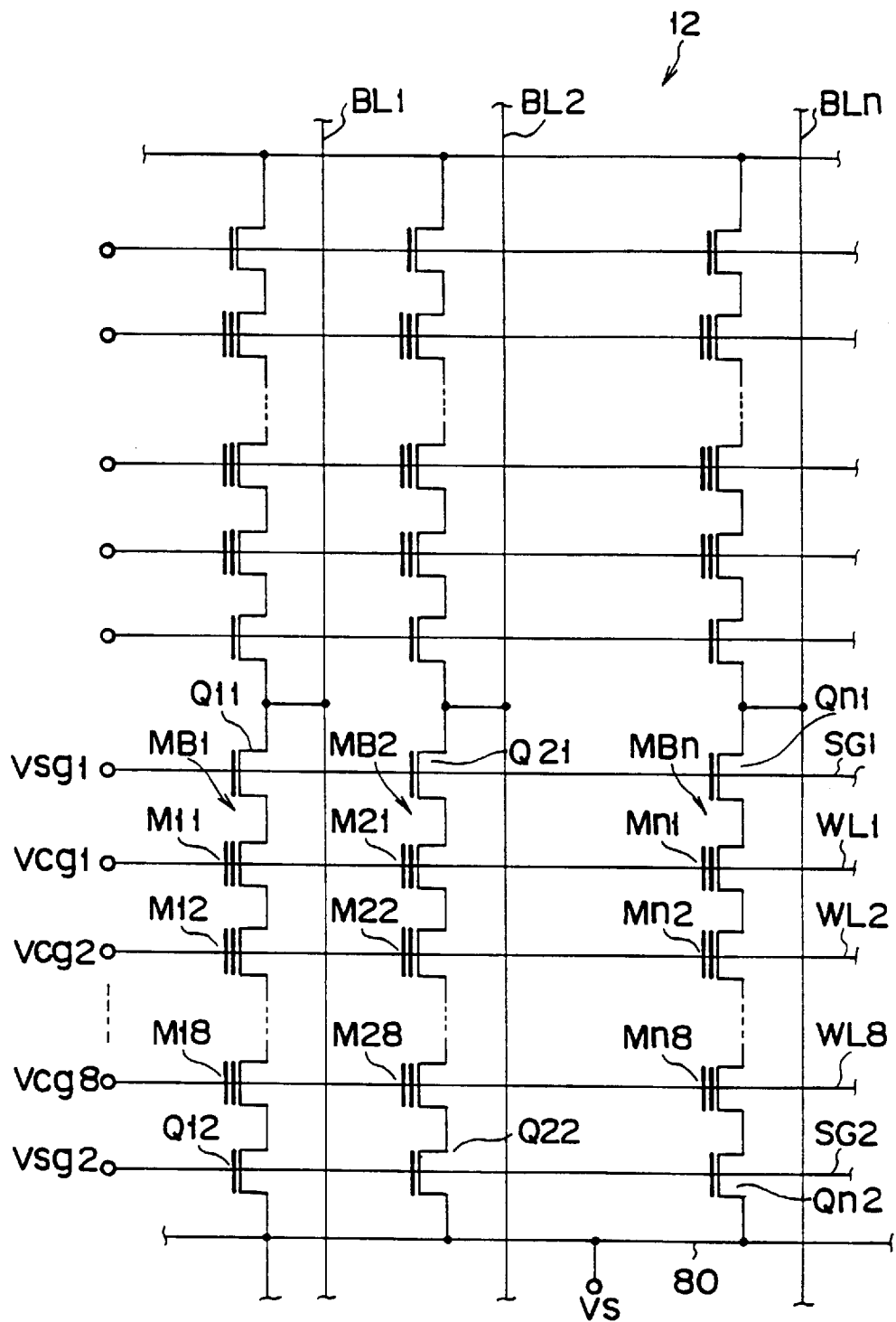
F I G. 2

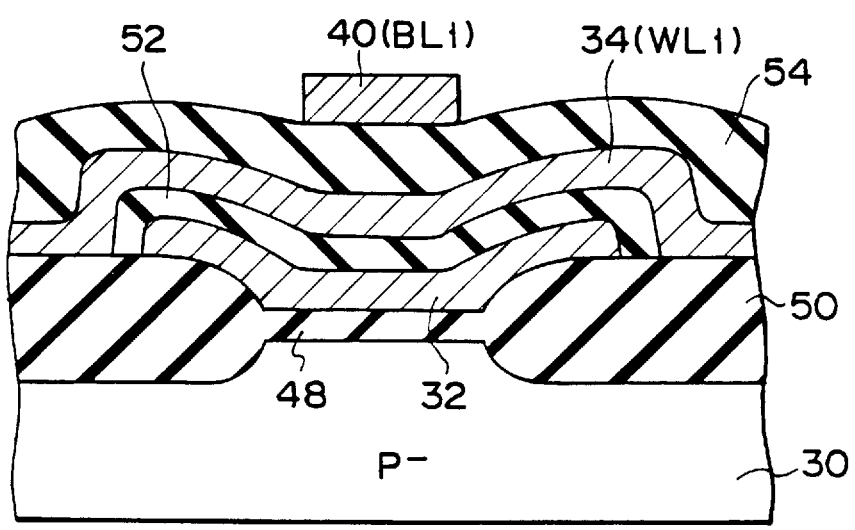
F I G. 4

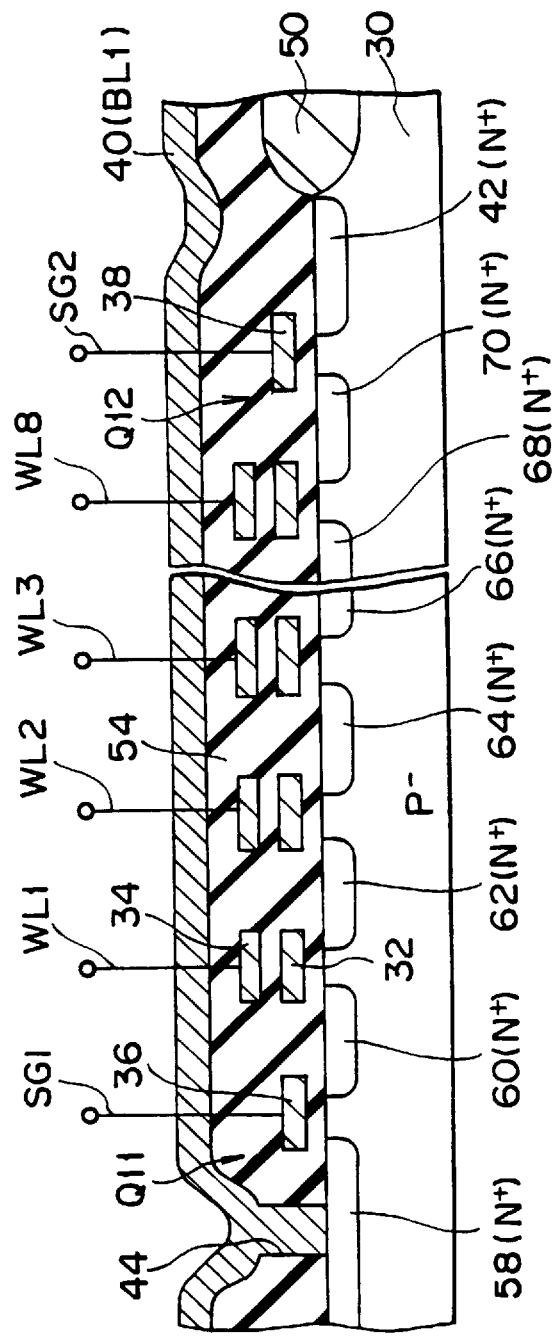
F I G. 5

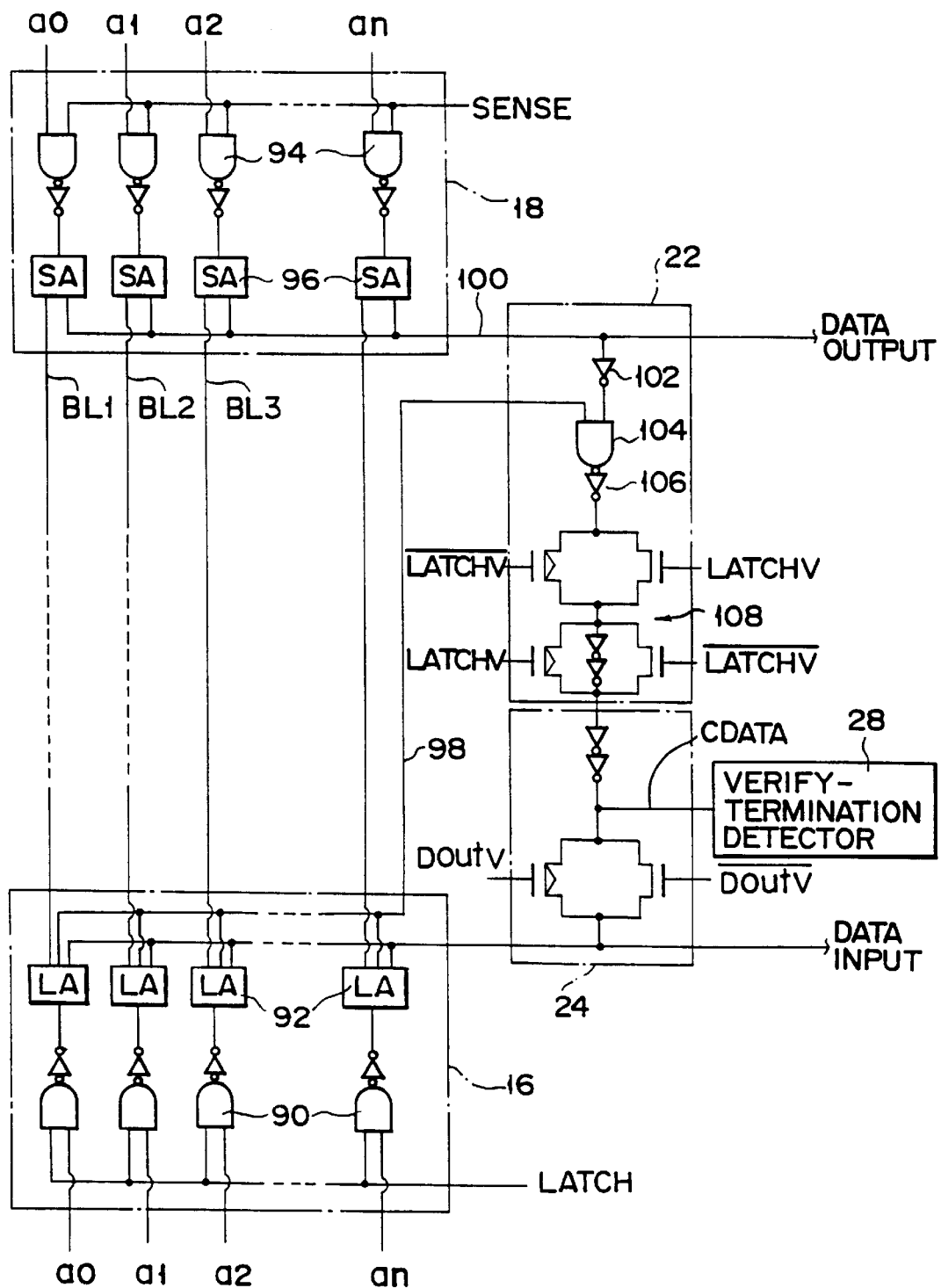
F I G. 6

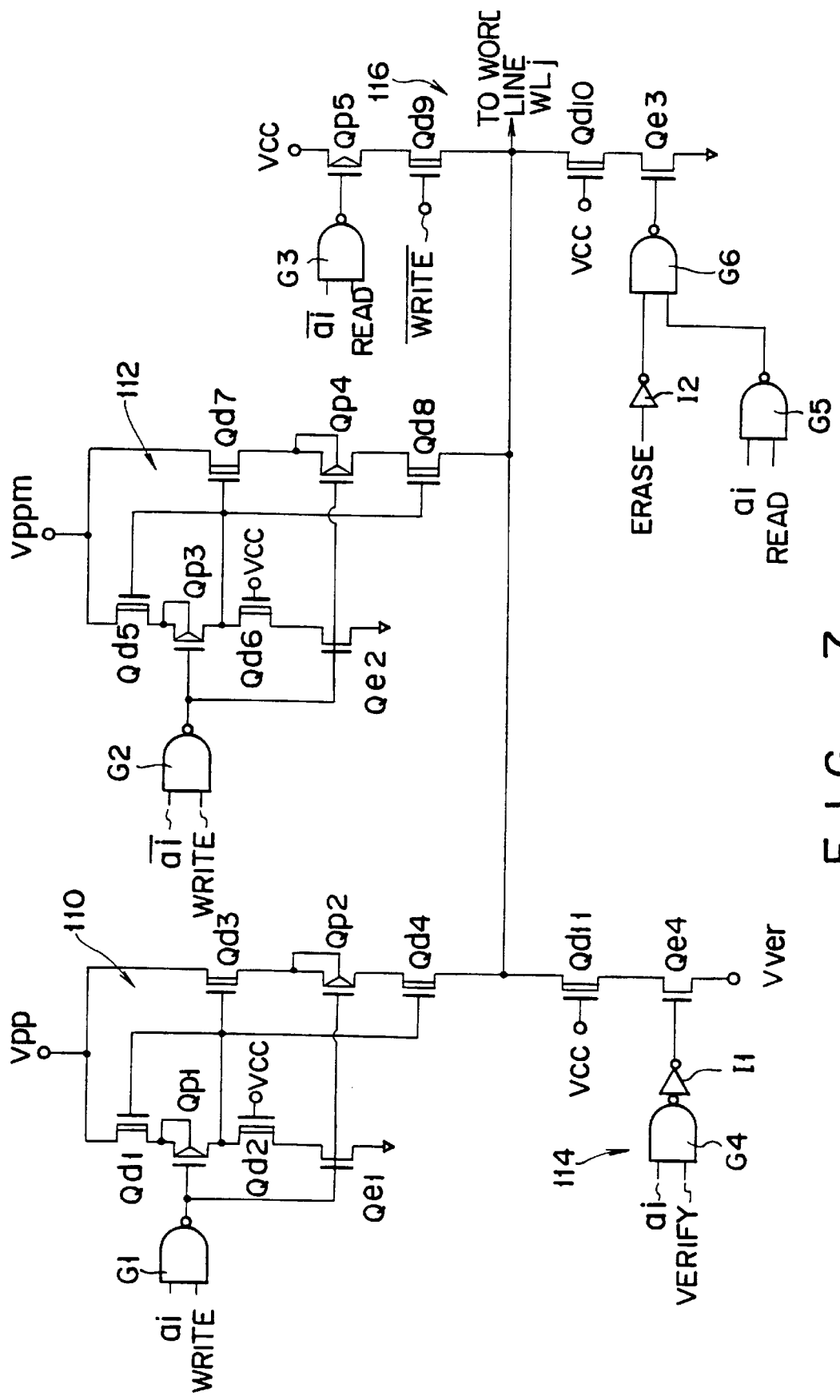
F I G. 7

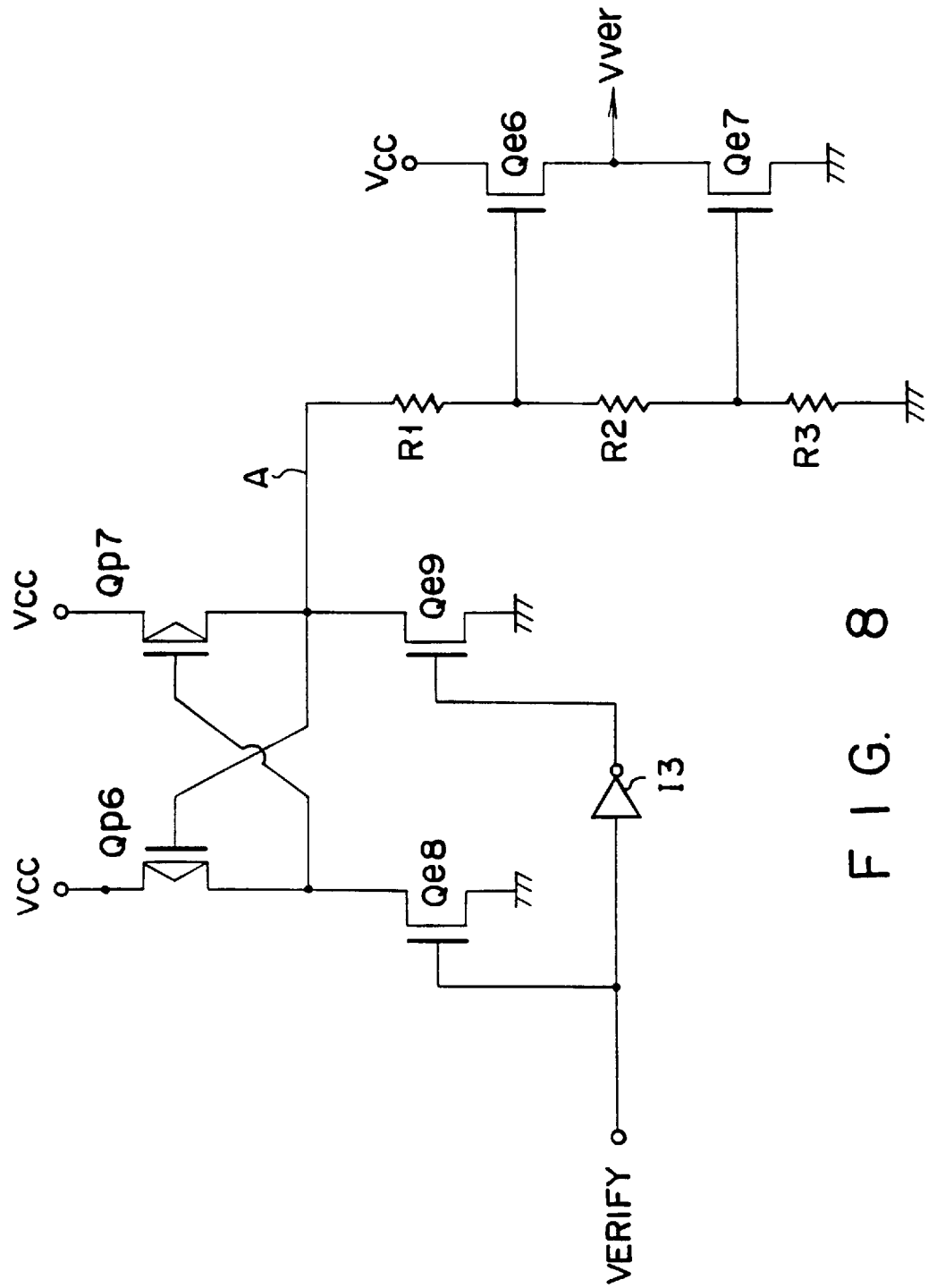
F I G. 8

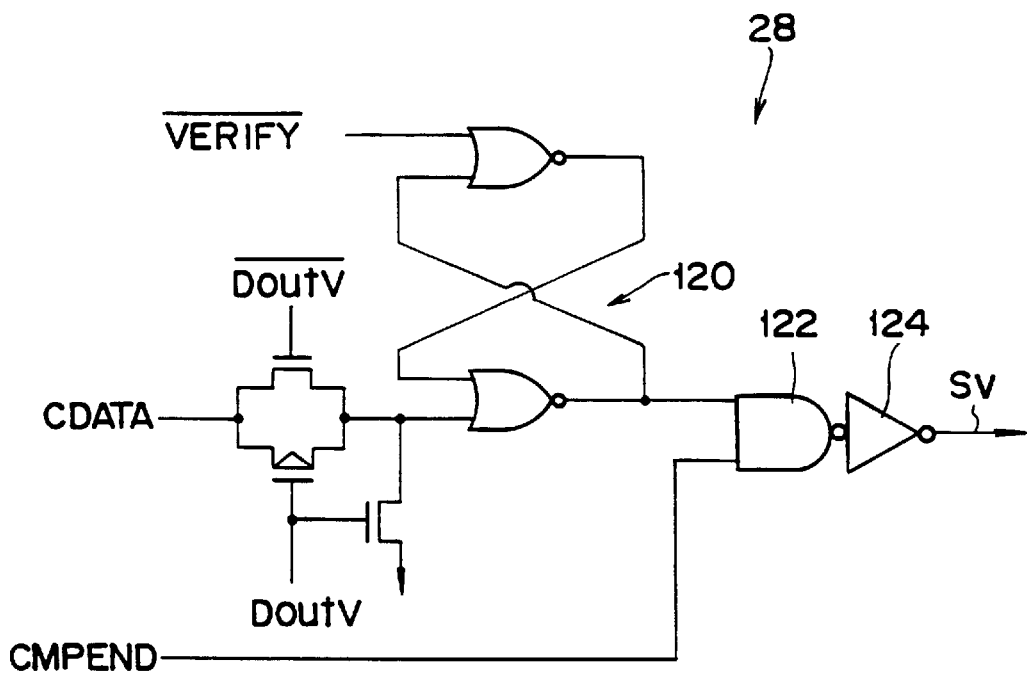
F I G. 9

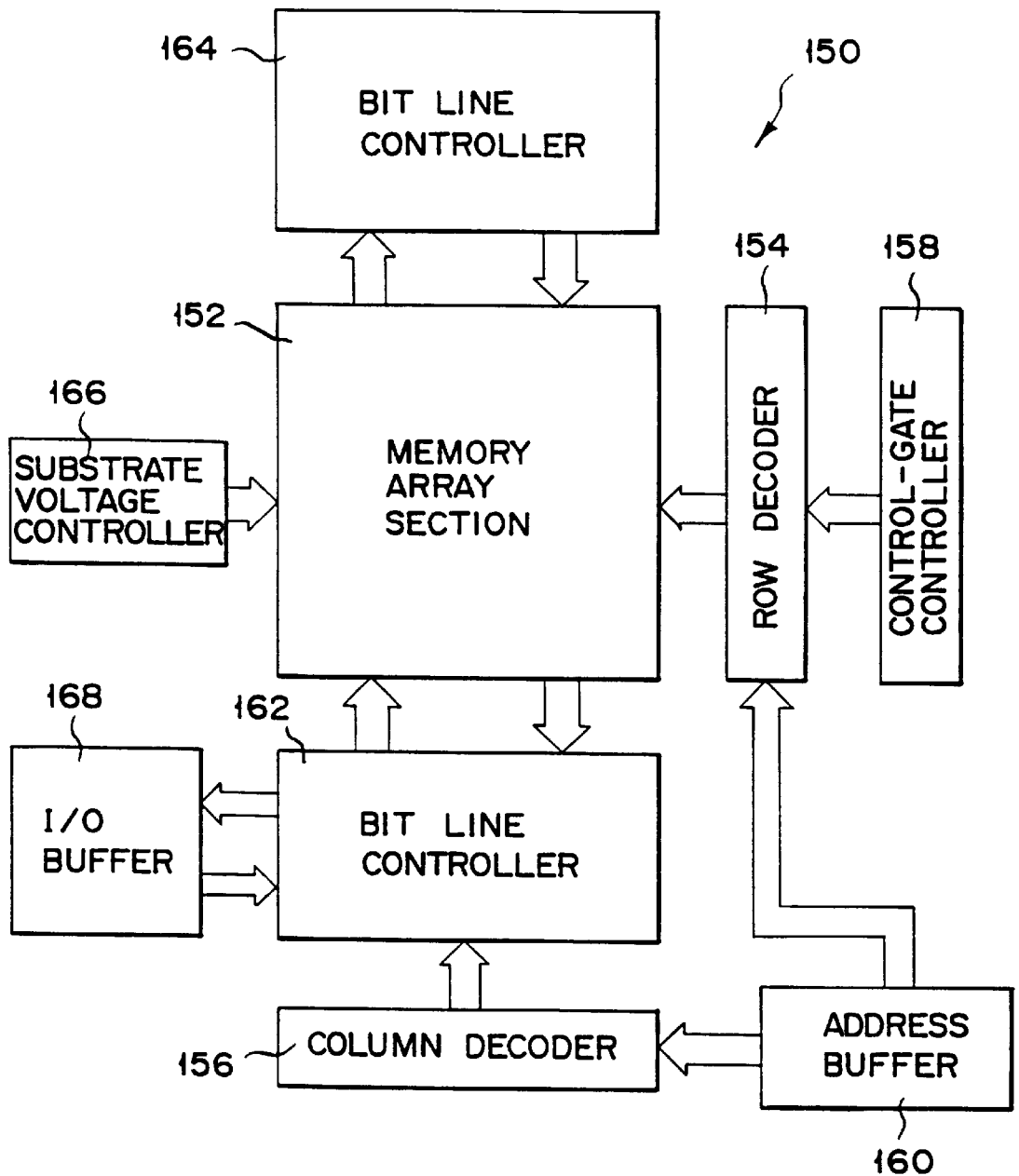
F I G. 11

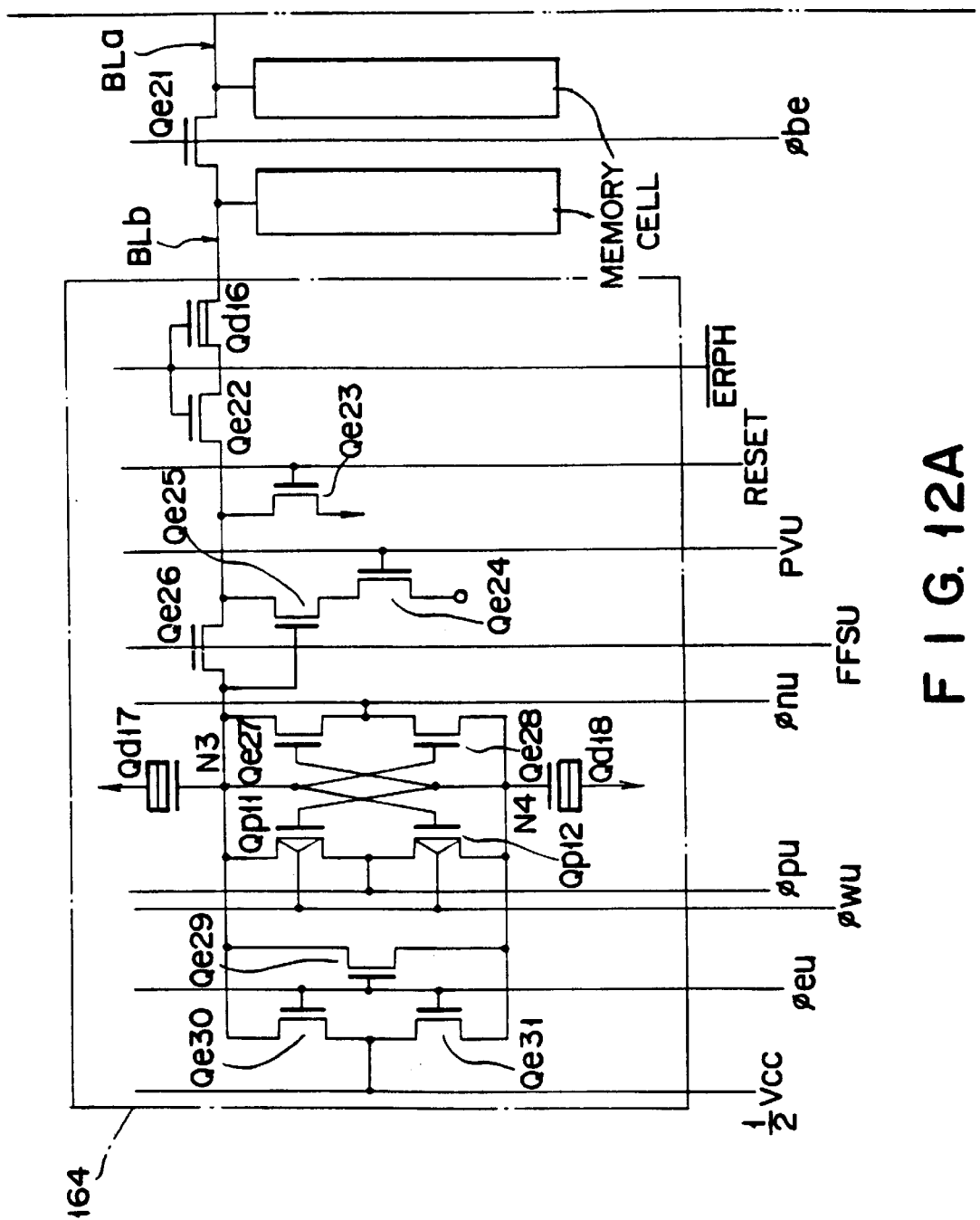
F I G. 12A

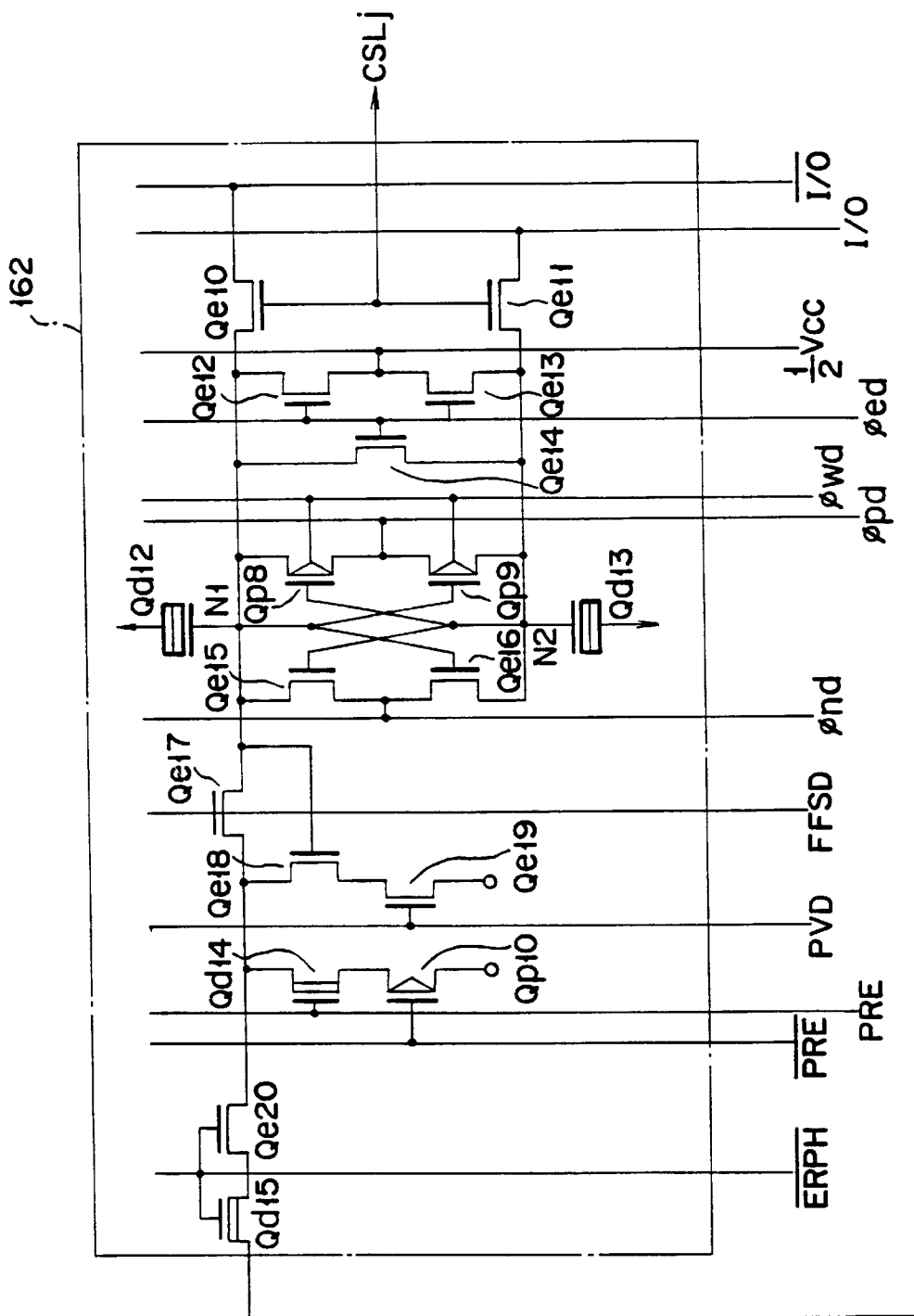
F I G. 12B

ELECTRICALLY ERASABLE PROGRAMMABLE READ-ONLY MEMORY WITH THRESHOLD VALUE CONTROLLER FOR DATA PROGRAMMING AND METHOD OF PROGRAMMING THE SAME

This is a Continuation, of application Ser. No. 08/376,665, filed on Jan. 23, 1995, now U.S. Pat. No. 5,657,270, which is a Continuation of application Ser. No. 08/145,308, filed Nov. 3, 1993, now abandoned, which is a Continuation of Ser. No. 07/677,762, filed Mar. 29, 1991, now abandoned.

BACKGROUND OF THE INVENTION

1. Field of the Invention

The present invention relates generally to non-volatile semiconductor memories and, more particularly, to electrically erasable programmable read-only memory devices of large capacity.

2. Description of the Related Art

With the increasing needs for high performance and high reliability of digital computer systems, it has been strongly required to develop a rewritable semiconductor memory having a memory capacity which is so large that the memory can be used instead of an existing external data storing medium such as a magnetic disk or a fixed disk unit (which is sometimes called a "hard disk device") used for a computer.

Recently, in order to meet the above requirement, an electrically erasable programmable non-volatile read-only memory (hereinafter referred to as an "EEPROM" according to the custom of this technical field) in which the memory integration density is enhanced by reducing the number of transistors used in each memory section on a chip substrate with limited size has been proposed and developed.

This type of EEPROM is typically called a "NAND type EEPROM" in which series circuits of floating gate type metal oxide semiconductor field effect transistors (referred to as "MOSFETs" hereinafter) are connected to a corresponding bit line via a switching transistor. The switching transistor is rendered conductive when designated to selectively connect the series array of floating gate type MOSFETs to a corresponding bit line associated therewith, and is generally called a "select transistor."

Each of the series-arrayed floating gate type MOSFETs is a minimum element for storing data and may be considered to correspond to a memory cell of a conventional dynamic random access memories, that is, DRAMs (of course, the series array of MOSFETs itself is sometimes called a "memory cell." The naming is not particularly important. For example, in this patent specification, each series array of MOSFETs will be named as a "NAND cell unit"). In general, each transistor array consists of four, eight or sixteen floating gate type MOSFETs. Each MOSFET has a control gate connected to a corresponding word line and a floating gate for storing charges representing logic data of "1" or "0." Since each memory cell can be formed of one floating gate type MOSFET, the integration density of the EEPROM can be enhanced and therefore the memory capacity thereof can be increased.

In the above NAND type EEPROM, data is sequentially written into the floating gate type MOSFETs, that is, memory cell transistors in each NAND cell unit. In a case where logic data is written into the EEPROM at a desired memory address, that is, into a selected one of the floating gate type MOSFETS of the designated NAND cell unit, a high voltage Vpp of 20 volts, for example, and an intermediate voltage Vppm, which has a potential level between the power source voltage Vcc of the EEPROM and the high voltage Vpp and is typically set at 10 volts when the power source voltage Vcc is 5 volts, are used as follows. The high voltage Vpp is applied to the control gate electrode of a selected memory cell transistor and the intermediate voltage Vppm is applied to the control gate electrodes of non-selected memory cell transistors lying between the selected memory cell transistor and the select transistor. The non-selected memory cell transistors are rendered conductive.

Under such conditions, when a voltage of 0 volts is applied to a corresponding bit line as a data voltage representing a logic data value, the data voltage is transmitted to a target memory cell, that is, to the drain of the selected floating gate type MOSFET via the non-selected memory cell transistors which are rendered conductive. Therefore, in the MOSFET, electrons are injected by the tunnel effect from the drain into the floating gate electrode thereof. As a result, the threshold value of the MOSFET is shifted in a positive direction. Thus, logic data "1" is stored into a desired address location.

When the intermediate voltage Vppm is applied to the bit line, injection of electrons will not occur in the selected floating gate type MOSFET. In this case, the threshold value of the MOSFET is kept unchanged. This state is defined as a logic "0" storing state.

The operation of erasing data in the NAND cell type EEPROM is simultaneously effected for all of memory cells of the NAND type memory cell units. This is so-called "simultaneous erasing." At this time, all of the NAND cell units of the EEPROM are electrically separated from the bit lines, substrate and source voltage. The control gate electrodes of all of the memory cell transistors are set at 0 volts and the substrate voltage (and the well potential if the NAND cell units are formed in a well region) is set to the high voltage Vpp. As a result, in all of the memory cell transistors, electrons are moved from the floating gate electrodes thereof to the substrate (or the well region). The threshold values thereof are shifted in a negative direction. The stored data items are electrically erased at the same time.

In order to selectively read out stored data of a specified memory cell transistor, 0 volts is applied to the control gate electrode of the selected memory cell transistor. The control gate electrodes of the remaining memory cell transistors in the selected NAND cell unit are set to the power source voltage Vcc (=5 volts). The select transistors in the selected NAND cell unit are rendered conductive by application of the power source voltage Vcc to the gate electrodes thereof. The logic value of the stored data can be determined by checking whether or not current flows in a common source line which is also associated with the specified NAND cell unit including the selected memory cell transistor.

In the above data write-in or programming mode, those of the non-selected memory cell transistors of each NAND cell unit which lie between the target memory cell transistor and the select transistor function as "transfer gates" for transferring a logic data voltage to the selected memory cell transistor. It may be considered that the non-selected memory cell transistors also function as transfer gates for transferring readout data in the data readout mode.

To keep the data transferring efficiency high, the threshold voltages (the voltages representing the threshold values) of the memory cell transistors serving as the transfer gates are required to be always set within a properly defined range.

For instance, the threshold voltage of the memory cell transistors in which a logic "1" data has been written is preferably maintained in a specific potential value ranging from 0.5 to 3.5 volts. In addition, the EEPROM comes with variation in the power source voltage itself, variation in quality caused in the manufacturing process and/or aging variation or deterioration in the physical property of the EEPROM under various application environments—especially, temperature—for the end users. Taking such fact into consideration, it would be desirable to design a range narrower than the above range so as to add a safety margin. Otherwise, the high operation reliability will no longer be expected for the NAND cell type EEPROMS.

With a conventional data programming scheme, it is difficult to precisely control variation in the threshold voltages of data-programmed memory cell transistors so as to fall within the allowable range. The data programming characteristic of each memory cell transistor tends to be varied in accordance with the aforementioned parameters. Even when the data-programming is executed under the same data write condition, the NAND cell units are not identical with one another in their data writing properties such that "difficult-to-write" as well "easy to-write" memory cell transistors will appear in the EEPROM. Conventionally, time length management is applied to cause the data writing time to be simply lengthened so as to compensate for the above variation in the threshold voltages among the memory cell transistor. With such a time management, however, while the data-writing at the "difficult-to-write" cells can be made successfully, the "easy-to-write" cells are forced to be in what is called the "over-write" condition. As a result, the threshold voltages of such cells will go far beyond the allowable range.

SUMMARY OF THE INVENTION

It is therefore an object of the present invention to provide a new and improved electrically erasable programmable semiconductor memory device which is excellent in operation reliability.

In accordance with the above object, the present invention is drawn to an electrically erasable non-volatile semiconductor memory device which comprises a semiconductive substrate, parallel data transfer lines arranged on the substrate, and parallel control gate lines provided on the substrate to insulatively intersect the data transfer lines so as to define intersections therebetween.

Metal insulator semiconductor field effect transistors are arranged at the intersections as memory cell transistors. Each memory cell transistor has a control gate electrode and an electrically floating gate electrode for charge storage, and is connected at its control gate electrode to a corresponding one of the control gate lines. The memory cell transistors are arranged in a plurality of cell units each of which has a preselected number of series-connected memory cell transistors having a first end connected to a corresponding one of the data transfer lines and a second end connected to a common source line together with others of the series-connected memory cell transistors.

A data write controller is provided connected to the memory cell transistors, for, when a memory cell transistor is selected in one of the cell units in a data programming mode, selectively applying the gate electrode of the selected transistor with a biasing voltage of a preselected potential level, for verifying an electrical data write condition of the selected memory cell transistor after a data was electrically written into the selected memory cell transistor, and for performing, when the verified write condition is dissatisfied, a data re-writing operation so as to apply the selected memory cell transistor with an additional write-in voltage which compensates for the dissatisfaction of the verified write condition in the selected memory cell transistor.

The foregoing and other objects, features and advantages of the invention will become more apparent in the detail description of preferred embodiments presented below.

BRIEF DESCRIPTION OF THE DRAWINGS

In the detailed description of a preferred embodiments of the present invention presented below, reference is made to the accompanying drawings in which:

FIG. 2 is a diagram showing the circuit configuration of a memory array section of the EEPROM shown in FIG. 1;

FIG. 4 is a diagram showing the enlarged sectional view of a memory cell transistor of the NAND cell unit taken along the line IV—IV of FIG. 3;

FIG. 5 is a diagram showing another enlarged sectional view of the memory cell transistor of the NAND cell unit along the line V—V of FIG. 3;

FIG. 6 is a diagram showing a detailed circuit configuration of the main circuit components of the embodiment shown in FIG. 1;

FIG. 7 is a diagram showing a detailed configuration of a control-gate control circuit shown in FIG. 1;

FIG. 8 is a diagram showing a detailed configuration of a verify-voltage generation circuit to be provided in the embodiment shown in FIG. 1;

FIG. 9 is a diagram showing a detailed configuration of a verify-termination detector shown in FIG. 1;

FIG. 11 is a diagram showing the main structure of a NAND cell type EEPROM in accordance with another embodiment of the present invention;

FIGS. 12A and 12B are a diagram showing the overall circuit configuration of a couple of bit line control circuits shown in FIG. 11;

DETAILED DESCRIPTION OF THE PREFERRED EMBODIMENTS

Figure 1:
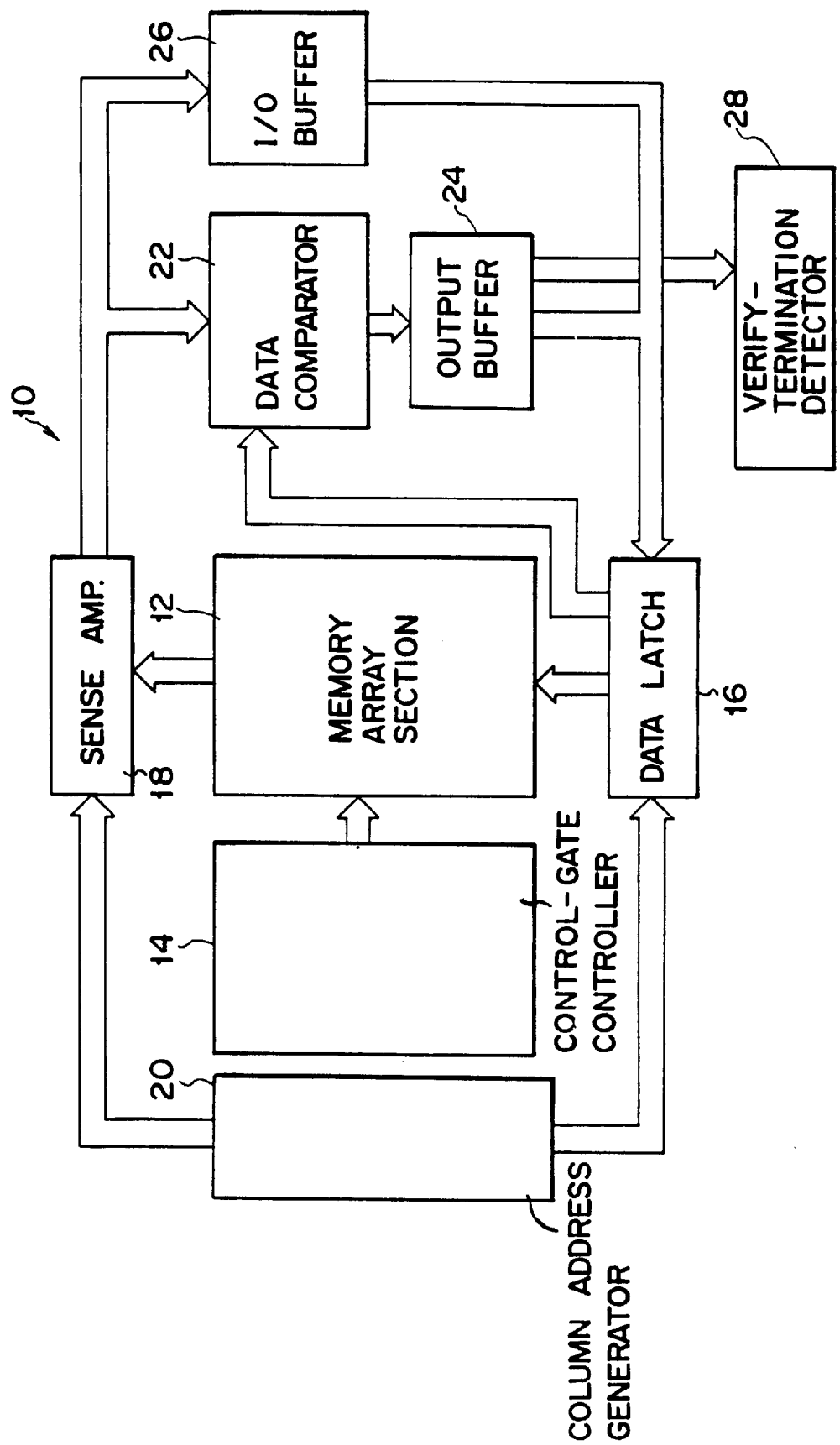
FIG. 1 is a diagram showing the main structure of a NAND cell type EEPROM in accordance with one preferred embodiment of the present invention.

Referring now to FIG. 1, a NAND cell type electrically erasable programmable read-only memory or EEPROM in accordance with one preferred embodiment of this invention is generally designated by a reference numeral "10." The NAND cell type EEPROM 10 has a main memory array section 12 with an array of memory cells in a matrix form.

The memory section 12 includes a previously selected number of memory cell transistors which will be described later in this description.

The memory array section 12 is associated with a control-gate control circuit 14, a data latch circuit 16 and sense amplifier circuit 18. These circuits 16 and 18 are provided for execution of data write and read operations in the EEPROM 10. A column address signal generation circuit 20 is connected to the data latch circuit 16 and the sense amplifier circuit 18.

The column address generator 20 generates a suitable control signal which is required for data write, read, or "write-verify" operating to be carried out in the EEPROM 10. The control signal is supplied to the memory section 12, as will be explained in detail later. When a "write-verify" operation is being performed in a data write mode, the sense amplifier circuit 18 performs a sensing operation in accordance with a column address signal generated by the column address generator 20. The data latch circuit 16 then latches a data to be re-written into a selected memory cell.

The output of the data latch circuit 16 is connected to the first input of a data comparison circuit 22. The output of the sense amplifier circuit 18 is connected to the second input of the data comparator 22. The output of the data comparator 22 is fed back to the data latch circuit 16 via an output buffer circuit 24. The output of the sense amplifier circuit 18 is connected to an input/output (I/O) data buffer circuit 26, which has its output connected to the data latch circuit 16 as shown in FIG. 1. A verify-termination detection circuit 28 is provided which has its input connected to the output buffer circuit 24.

The data comparator 22 compares a write data being latched by the data latch circuit 16 with a data read out by the sense amplifier circuit 18 with respect to every column address, in the verify operation performed during programming. The comparison result is then held or latched temporarily within the data comparator 22.

The output signal of the data comparator 22 indicative of the comparison result is supplied via the output buffer 24 to the verify-termination detection circuit 28. The selected memory cells in the memory array section 12 are subjected to programming, i.e., data writing operation in accordance with data kept in the data latch circuit 16. After such a data writing, a "write-verify" operation is now executed under the control of the control-gate controller 14.

The "write-verify" operation may be defined as an operation of verifying or confirming whether the data voltages that have been actually written into the designated memory cell transistors are distributed so that they fall within a predetermined allowable range, which is normally between 0.5 and 3.5 volts. The verify-termination detector 28 monitors the written data voltages on the basis of the output signal of the data comparator 22. If it is verified that all of them fall within the allowable range, the verify-termination detector 28 generates a certain electrical signal as a "verify-termination signal." Obviously, if even one of the data voltages is out of the allowable range, the verify-termination signal will not be obtained. During such period of time, the data-writing operation is again executed with assistance of the controller 14. Such a "rewriting" will be repeated until when the verify-termination signal is generated by the detector 28.

A description is now given of the internal arrangement of the memory array section 12. As shown in FIG. 2, the NAND cell type EEPROM 10 has parallel data transfer lines BL and parallel address control lines WL in the memory section 12. The address control lines WL insulatively intersect the data transfer lines insulatively arranged on a chip substrate 30 (see FIG. 3). The data transfer lines BL are called "bit lines"; the address control lines WL are called "word lines."

Each bit line BLi (i=1, 2, . . . , n) is connected to series circuits MB of a previously selected number of floating gate type metal oxide semiconductor field effect transistors. In this embodiment, each transistor series circuit MBi consists of eight floating gate type MOSFETs Mi1, Mi2, . . . , Mi8. For example, the transistor series circuit MB1 has floating gate type MOSFETs M11, M12, . . . , M18 as shown in FIG. 2. Each MOSFET Mij (i=1, 2, . . . , N; j=1, 2, . . . , 8) functions as a memory cell for storing unit logic data. The series array of eight memory cells is hereinafter referred to as a "NAND cell unit" and the floating gate type MOSFETs M are referred to as "memory cell transistors" or simply "memory cells." The construction of the upper half of the memory cell matrix in FIG. 2 is essentially the same as that described above.

In each NAND cell unit MBi, memory cell transistors Mi1, Mi2, . . . , Mi8 are electrically connected at the control gate electrodes thereof to the word lines WL1, WL2, . . . , WL8, respectively. Each of the NAND cell units MB1, MB2, . . . , MBn is connected to a corresponding bit line BLi via a first single gate type metal oxide semi-conductor field effect transistor or MOSFET Qi1. For example, the NAND cell unit MB1 is connected to the bit line BL1 via the MOSFET Q11. The MOSFETs Q1 (=Q11, Q21, . . . , Qn1) are commonly connected at the gate electrodes thereof to a select gate line SG1. Each MOSFET Qi1 is selectively rendered conductive in response to a voltage signal Vsg1 supplied to the select gate line SG1 and causes a NAND cell unit MBi associated therewith to be electrically connected to a corresponding bit line BLi. The switching MOSFET Qi1 is referred to as a "first select transistor."

As shown in FIG. 2, the NAND cell units MB1, MB2, . . . , MBn are commonly connected to a common source potential Vs, which is the same as the ground potential and is 0 volts in this embodiment, via second single gate type MOSFETs Q2 (=Q12, Q22, . . . , Qn2), respectively. For example, in the NAND cell unit MB1, the second MOSFET Q12 is connected between the source electrode of a final-stage memory cell transistor M18 included in the NAND cell unit and the common source potential Vs. The second MOSFETs Q2 are commonly connected at the gates thereof to a second select gate line SG2. Each MOSFET Qi2 effects the switching operation in response to a voltage signal vsg2 supplied to the select gate line SG2, and when it is turned on, it electrically connects the NAND cell unit MBi associated therewith to the common source potential Vs. The switching MOSFET Qi2 is hereinafter referred to as a "second select transistor."

Figure 3:
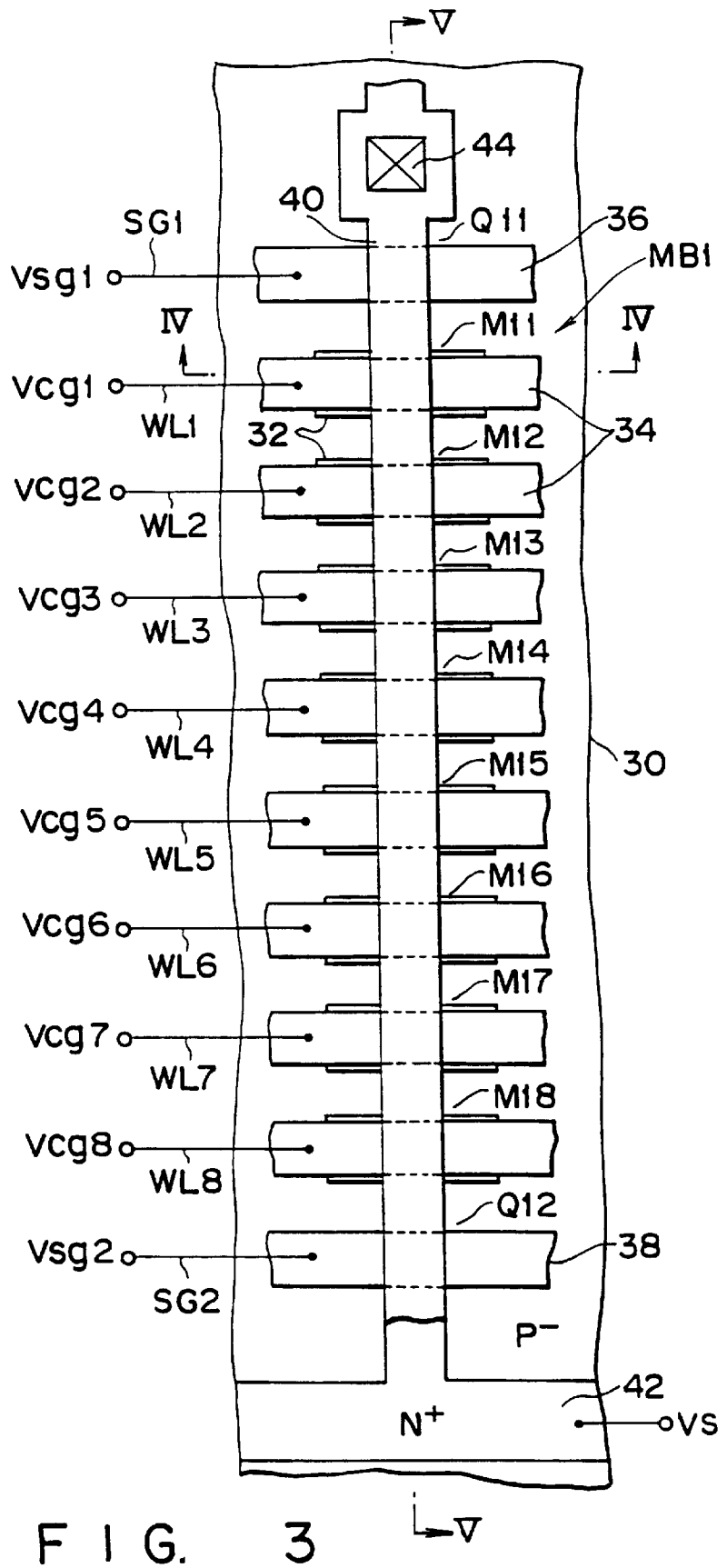
FIG. 3 is a diagram showing the plan view of one of NAND cell units defined in the memory array section of FIG. 2.

The plan view of eight memory cell transistors M11 to M18 of the NAND cell unit MB1 is shown in FIG. 3. For easy understanding, insulation layers are omitted in FIG. 3. Each memory cell transistor Mlj (j=1, 2, . . . , or 8) has a floating gate electrode 32 insulatively formed over a lightly doped P type (P- type) substrate 30. The floating gate electrode acts as a charge storage means. Each memory cell transistor also has a control gate electrode 34 insulatively formed over the floating gate electrode. In FIG. 3, the underlying floating gate electrode 32 is shown to be wider than the control gate electrode 34; however, this is merely a symbolic illustration. In practice, the width thereof is substantially the same as that of the control gate electrode. The first and second select transistors Q11 and Q12 are arranged on both end portions of the memory cell transistors M11 to M18. The select transistors Q11 and Q12 respectively include gate electrodes 36 and 38 which are hereinafter referred to as "select gate electrodes."

The bit line BL1 may be a metal layer 40 which is formed with a small width to extend and insulatively intersect the control gate electrodes 34, the first select gate electrode 36, and the second select gate electrode 38. In FIG. 3, the bit line BL1 is illustrated to be partly cut away in the lower portion of the drawing for convenience so that a heavily-doped N type (N+ type) semiconductor diffusion layer 42 formed in the surface area of the substrate 30 will be visible. The layer 42 holds the common source voltage Vs described before. The first select transistor Q11 is electrically connected at the drain to the bit line BL1 via a contact hole portion 44 formed in the metal wiring 40 which is the bit line BL1. The second select transistor Q12 is connected at the source thereof to the common source voltage Vs.

The cross sectional structure of one—memory cell M11, for example—of the memory cell transistors included in the NAND cell unit MB1 is shown in FIG. 4 in detail. A thin insulation film 48 is deposited in an element area defined by element isolation insulation layers 50 on the top surface of the P type substrate 30. The insulation layers may be chemical vapor deposition oxide films. The insulation film 48 functions as a gate insulation film. The floating gate electrode 32 is stacked on the gate insulation film 48. The length thereof is determined so that it may partly cover the element isolation insulation layer 50. The floating gate electrode 32 is covered with an insulation layer 52. The control gate electrode 34 having substantially the same width as the floating gate electrode 32 is formed on the insulation layer 52. As shown in FIG. 3, the electrode 32 is arranged to extend to the length corresponding to the word line WL1. The floating gate electrode 32 defines a preselected capacitance between it and the substrate 30; it also defines another capacitance between it and the control gate electrode 34. The control gate electrode 34 is covered with an insulation layer 54. The metal wiring layer 40 which is the bit line BL1 is arranged.

Turning now to FIG. 5, N+ type semiconductor diffused layers 58, 60, 62, 64, 66, . . . , 68, 70 and 42 are arranged with a preset distance therebetween along the lengthwise direction of the bit line BL1 on the top surface portion of the P type substrate 30. The N+ type layer 58 serves respectively as the drain of the first select transistor Q11. It will be easily understood by just viewing the drawing that the layer 58 is connected to the metal wiring layer 40 which is the bit line BL1 via the contact hole portion 44. The N+ type layer 60 serves as the source of the first select transistor Q11. At the same time, the N+ type layer 60 serves as the drain of the adjacent memory cell transistor M11. Likewise, the N+ type layer 62 serves as the source and drain of the adjacent memory cell transistors M11 and M12. The N+ type layer 42 serves as the source of the second select transistor Q12 and at the same time it is connected to the common source voltage Vs.

Turning back to FIG. 2, the NAND cell units MB1, MB2, . . . , MBn are connected in common to a common source line 80 at the sources of the second select transistors Q12, Q22, . . . , Qn2. The common source line 80 is made of the N+ type semiconductor diffusion layer 42 shown in FIG. 3. The line 80 is kept at the common source voltage Vs, which is set to 0 volts except in an erase operation.

The internal circuit configuration of the sense amplifier circuit 18, the data latch circuit 16, the data comparator 22, and the output buffer 24, which are illustrated in FIG. 1, is shown in detail in FIG. 6. The data latch circuit 16 includes an array of logic gate sections 90 for receiving a latch signal LATCH and an address signal a0, a1, a2, . . . , an. Latch circuits 92 are connected with these logic gates 90, for temporarily latching a data indicative of the address signal that is selected by the logical processing of the logic gates 90. The sense amplifier circuit 18 includes logic gate sections 94 for receiving a sense control signal SENSE and an address signal ai (i=0, 1, 2, . . . , n), and sense amplifiers 96 that are associated with the logic gates 94. When a corresponding one of the logic gates 94 is selected in response to an address signal ai, the sense amplifier circuit 18 senses, at a corresponding sense amplifier 96, the data voltage on the bit line BLi of the selected address and then outputs the same.

The data voltage latched in the data latch circuit 16 is sent to the data comparator 22 via a wiring line 98. The output of the sense amplifier circuit 18 is supplied by a wiring line 100 to the data comparator 22. The data comparator 22 has an inverter 102 connected to the line 100, and an NAND gate 104 having a first input connected to the output of the inverter 102 and a second input connected to the line 98. The output of the NAND gate 104 is connected to an internal latch circuit 108 through the inverter 106. The internal latch circuit 108 latches a data voltage input thereto in response to latch signals LATCHV and $\overline{\text{LATCHV}}$. In other words, the comparison result obtained by the data comparator 22 may be maintained temporarily at the internal latch circuit 108. The output of the data comparator 22 will be transferred via the output buffer 24 to the verify-termination detector 28.

FIG. 7 shows a detailed configuration of the gate controller 14 shown in FIG. 1. This controller includes a high-voltage generation circuit 110 for generating a high-level voltage Vpp which is supplied to the selected control gate in a data write mode, an intermediate voltage generation circuit 112 which supplies non-selected control gates with an intermediate voltage Vppm, a verify voltage generation circuit 114 for generating a verify voltage Vver in a write-verify operation mode, and an erase/readout control circuit 116. Such circuit configuration is provided for each control gate line.

The high-voltage generator 110 is mainly constituted by a NAND gate G1 for executing a logic processing between a write signal WRITE and an address signal ai, an enhancement type (E-type) N-channel MOS transistor Qe1 for switching in response to an output signal of the NAND gate G1, E-type P-channel switching MOS transistor Qp1, and an E-type P-channel MOS transistor Qp2 serving as an output buffer. A |D-type| N-channel MOS transistor Qd2 is provided between the MOS transistors Qe1 and Qp1, for protecting the switching MOS transistor from unintentional application of a high voltage. A D-type N-channel MOS transistor Qd1 is provided between the MOS transistor Qp1 and a high-voltage terminal to which the high voltage Vpp is applied, for providing a high-voltage protection for the MOS transistor. Similarly, D-type N-channel MOS transistors Qd3 and Qd4 are provided for the bufferstage MOS transistor Qp2. Using such D-type N-channel MOS transistors may facilitate the high voltage Vpp to be effectively supplied to a control gate line(s) without any decrease in the threshold voltage. In particular, the MOS transistor Qd4 functions, when a control gate line is applied with a positive voltage from an external circuit, to prevent the drain junction of the P-channel MOS transistor Qp2 from being in reverse-biased.

The intermediate voltage generator 112 is arranged similarly as in the above circuit 110: It includes a NAND gate G2, an E-type N-channel switching MOS transistor Qe2 controlled by an output of the NAND gate G2, an E-type P-channel switching MOS transistor Qp3, an E-type P-channel MOS transistor Qp4 serving as an output buffer, and D-type N-channel MOS transistors Qd5 to Qd8.

The erase/readout controller 116 is constituted by NAND gates G3 and G5 for performing logical operation for a read signal READ, an address signal ai, and an address signal $\overline{ai}$, an inverter gate I2 for receiving an erase signal ERASE, a NAND gate G6 for logically processing outputs of the inverter gate I2 and the NAND gate G5, an E-type P-channel MOS transistor Qe3 having its gate electrode connected to the output of NAND gate G6, an E-type P-channel MOS transistor Qp5 having its gate electrode connected to the output of the gate G3, and D-type N-channel MOS transistors Qd9 and Qd10 as protection transistors which are provided as shown in FIG. 7.

The verify controller 114 includes a NAND gate G4 for executing a logical processing between a verify signal VERIFY and an address ai, an inverter I1 connected to the NAND gate G4, an E-type N-channel MOS transistor Qe4 having its gate electrode connected to the output of the inverter I1 for supplying a verify voltage Vver to a corresponding control gate line, i.e., word line WLj, and a D-type N-channel MOS transistor Qd11 provided between the transistor Qe4 and the word line WLj.

The verify controller 114 includes a verify voltage generation circuit that may be typically arranged as shown in FIG. 8. The verify voltage Vver is a voltage which is to be generated when a verify signal VERIFY is supplied and which has an intermediate voltage potential between the power supply voltage Vcc and the ground potential. The verify voltage Vver is supplied to a certain control gate line (word line) that is selected by the verify voltage generation circuit 114. In this embodiment, the circuit for generating such verify voltage Vver is formed of a series circuit of E-type N-channel MOS transistor Qe6 and Qe7 provided between a power supply voltage terminal Vcc and a ground potential. A voltage divider circuit having resistors R1 to R3 is provided to supply gate electrodes of these transistors Qe6 and Qe7 with a suitable bias voltage.

Principally, the power supply voltage Vcc may be simply applied at a node A of the voltage divider circuit. With such a simple voltage application, a feed-through current will occur undesirably. To prevent such phenomenon, with this embodiment, a switch circuit is provided which consists of E-type N-channel MOS transistors Qe8 and Qe9, E-type P-channel MOS transistors Qp6 and Qp7, and an inverter I3. More specifically, when the verify signal VERIFY is set in the "H" level, the MOS transistors Qe8 is rendered conductive, the transistor Qp7 is rendered conductive, and the transistor Qe9 is rendered nonconductive. As a result, a specific voltage is obtained which is determined in accordance with the voltage division ratio of the voltage divider circuit and has an intermediate voltage level corresponding to the conductive condition of the transistors Qe6 and Qe7. When the verify signal VERIFY is set in the "L" level, the transistor Qe9 becomes conductive, so that the node A of the voltage divider circuit is identical with the ground potential. The verify voltage terminal Vver is thus electrically floating. At this time, no currents flow in the switch circuit, since the transistor Qp7 is rendered nonconductive.

The verify termination detector 28 may be arranged as shown in FIG. 9 to include a flip-flop section 120, an NAND gate 122, and an inverter 124. A verify termination signal Sv appears at the output of the inverter 124.

The operation mode of the EEPROM thus arranged will now be described below.

Prior to execution of data write, i.e., data programming, all the memory cells are first subjected to data-erasing, which is called the "simultaneous data erase." In the data erase mode, all the control gate lines including the select gate lines SG and word lines WL are applied with a voltage of 0 volts. More specifically, in the control circuit configuration shown in FIG. 7, an erase signal ERASE is supplied to the erase/readout controller 116. Responding to the signal, the MOS transistor Qe3 is rendered conductive so that the word lines WL are set at 0 volts. The select gate lines SG1 and SG2 are also kept at 0 volts. While the bit lines BL and the common source line 80 is forced to be electrically floating, the high voltage Vpp is applied to the lightly-doped P type substrate 30 (or an P type well region formed in an N type substrate, if any). Such biasing state is being held for a preselected length of time period, 10 milliseconds, for example, whereby electrons are released from the floating gates of all the memory cell transistors, so that the threshold voltages thereof are shifted to have a negative polarity value. This may corresponds to the data "0" storage condition.

A data write or programming is carried out as will be described as follows. A data of "one word" is latched in the data latch circuit 16. The bit line voltage is controlled in response to the data storage, so that a logical "0" or "1" will be written into a selected memory cell transistor. At this time, a selected word line WLj is applied with the high voltage Vpp; non-selected word lines associated those of non-selected memory cell transistors that are positioned between the selected word line and the first select transistor Qi1—that is, the memory cell transistors Mi1, Mi2, . . . , Mi(j−1)—are applied with the intermediate voltage Vppm. A write signal WRITE is input to the control circuit shown in FIG. 7. In other words, one of the high-voltage generator 110 and the intermediate voltage generator 112 is selectively rendered operative in response to the logical processing between the write signal WRITE and the address signals ai and $\overline{ai}$ in such a manner that the high voltage Vpp is sent to the selected word line while the intermediate voltage Vppm is applied to the aforementioned non-selected word lines. A bit line associated with the selected memory cell transistor is applied with a 0-volt voltage when a data "1" is to be written; it is applied with the intermediate voltage Vppm in the case of writing a data "0." The time length for maintaining the above biasing condition for data writing is so set as to be much shorter than that used in the conventional data write mode. The maintenance time is preferably 1/100 smaller than the conventional one; it may be 10 microseconds, for example. In the memory cell transistor into which the "1"1 data has been written, the threshold voltage is shifted to have a positive value. On the other hand, in the memory cell transistor into which the "0" data has been written, the threshold voltage remains at a negative value.

Thereafter, a write-verify operation is in effect. With the present embodiment, verification is made to confirm whether the threshold voltage of data "1"-written memory cells reaches a preselected value. The threshold value may be determined in advance by taking into consideration the data storage characteristic of the memory cell transistors; it is typically 0.5 volts. The above verifying operation is executed with respect to each of the data-written memory cell transistors arrayed along a designated word line WLi.

Figure 10:
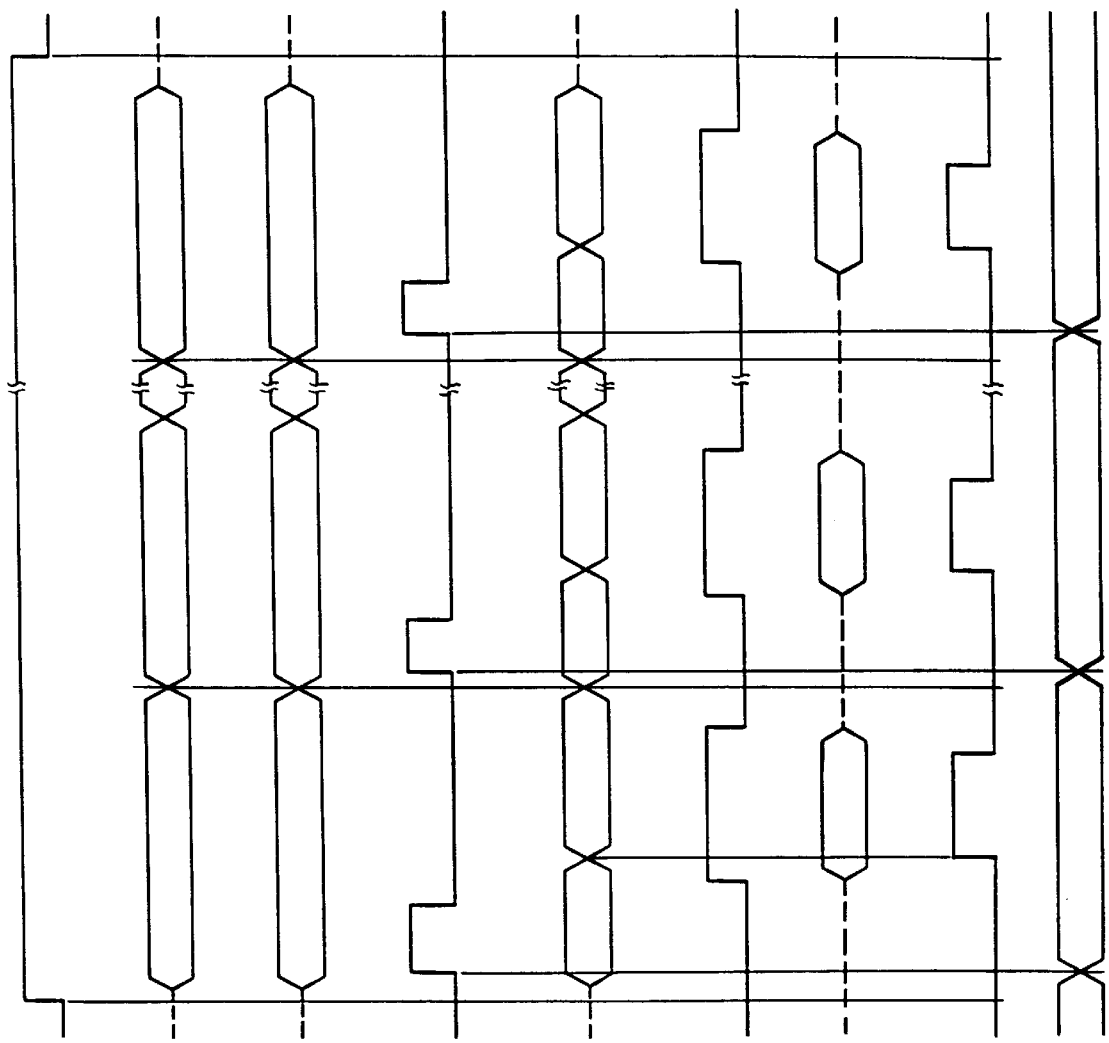
FIG. 10 is a diagram showing a timing chart of main voltage signals to be generated in the main portions of the embodiment shown in FIG. 1.

The timing chart of the verifying operation is shown in FIG. 10. When the sense signal SENSE is at the "H" level, the sense amplifier circuit 18 becomes enable. A column address ai is supplied by the address generator 20. Data is then output on a corresponding data output line, and data in the data latch circuit 16 appears on a latch output line 98 of the data latch circuit 16. In the verifying operation cycle, the control gate controller 14 is simultaneously supplied with the verify signal VERIFY and the readout signal READ. As a result of a logical processing between these signals and the address signals ai and $\overline{ai}$, the selected control gate line, i.e., word line, is supplied with the verify voltage Vver (=0.5 volts), which has an intermediate voltage level between the power supply voltage Vcc and the ground potential, as described above. The remaining, non-selected word lines are supplied with the power supply voltage Vcc, since the output of the NAND gate G3 in the erase/readout controller 116 is set at the "L" level. At this time, the select gate lines SG1 and SG2 are set at the power supply voltage Vcc, and the bit line is also at the voltage Vcc whereas the common source line 80 is at 0 volts.

With such a voltage application, if a selected memory cell is written with the data "1," and when the threshold voltage of it is more than 0.5 volts, the selected memory cell transistor becomes nonconductive, so that data "1" is read out. If the threshold voltage of the data "1"-written memory cell does not reach 0.5 volts, the selected memory cell transistor is rendered conductive, with the result in that a stored data is read out as a data "0." The written data and the readout data that is obtained during the above verifying operation are then compared by the data comparator 22 with each other. The comparison result is lathed when the latch signal $\overline{\text{LATCHV}}$ is set at the "H" level. If the readout data is a "1" data, it is inverted by the inverter 102 in the comparator circuit 22, and then sent to the NAND gate 104 together with the write data from the data latch circuit 16. When the write data has the "1" level, the readout data is changed to a "0" data by the inverter 106, and latched in the internal latch circuit 108. In such a case wherein the write-in data is "1" data and yet read out as a "0" data due to insufficient writing, it is latched in the latch circuit 108 as the "1" data. When the write-in data is a "0" data, it is latched as a "0" data in the latch circuit 108 in the comparator circuit 22, regardless of the level of the resultant readout voltage. The aforementioned data latching operations performed in the data comparator 22 may be summarized as shown in Table 1 that follows.

TABLE 1

| Data in Data Latch Circuit | 1 | 1 | 0 | 0 |
| Output of Sense Amplifier Circuit | 1 | 0 | 1 | 0 |
| Output of Data Comparator | 0 | 1 | 0 | 0 |

If even one of the outputs CDATA of the output buffer 24 exhibits "1," the verify termination detector 28 will not generate the verify termination signal Sv. The flip-flop circuit in the verify termination detector 28 shown in FIG. 9 is initiated in response to the write-verify signal $\overline{\text{VERIFY}}$, which is set at "0" in the write-verify mode. During the data comparison operation, when a "1" appears at the output of the comparator 22, the output of the flip-flop circuit is set at the "0". The verify termination signal Sv is kept at "0" when the data comparison signal CMPEND is set at "1" after the data comparison is completed with respect to all the bit lines BL1, BL2, . . . , BLn. This shows that verifying is not completed for all the write-in data. As is apparent from TABLE 1, "1" data is latched again with respect only to a specific address or addresses at which data programming is still insufficient. With such "relatching," the data "1" writing is repeatedly executed, which may be called the "data-rewriting" operation. A similar verifying operation is again performed. If any memory cell that is insufficient in data writing remains, the data rewriting and verification will be executed again. A plurality of combinations of re-writing and verification will be repeated until any insufficient write-in memory cells no longer remain in the EEPROM. Under such a condition, no "1"s appear in the output of the data comparator 22, and the flip-flop circuit output is being set at "1." When the data comparison completion signal CMPEND is at "1", the verify termination detector 28 then outputs a "1" data as the verify termination signal Sv. Now, the data writing mode is completed.

The application of several voltage signals at the main components of the EEPROM 10 in different operation modes may be summarized in the following TABLE 2. TABLE 2 has been prepared under assumption that a word line WL2 is selected in the data write and write-verify operations.

TABLE 2

|  | Erase | "1" Write | "0" Write | Write-Verify |
|---|---|---|---|---|
| Bit Line | Floating | 0 V | 10 V | 5 V |
| SG1 | 0 V | 10 V | 10 V | 5 V |
| WL1 | 0 V | 10 V | 10 V | 5 V |
| WL2 | 0 V | 10 V | 10 V | 5 V |
| WL3 | 0 V | 20 V | 20 V | 0.5 V |
| WL4 | 0 V | 10 V | 10 V | 5 V |
| WL5 | 0 V | 10 V | 10 V | 5 V |
| WL6 | 0 V | 10 V | 10 V | 5 V |
| WL7 | 0 V | 10 V | 10 V | 5 V |
| WL8 | 0 V | 10 V | 10 V | 5 V |
| SG2 | 0 V | 0 V | 0 V | 5 V |
| Common Source | Floating | 0 V | 0 V | 0 V |
| Substrate | 20 V | 0 V | 0 V | 0 V |

The data read operation of the EEPROM 10 is performed in substantially the same manner as in the conventional devices.

With the EEPROM 10 embodying the present invention, the length of data-writing time is shortened, and rewriting will be repeatedly executed for insufficient data-write-in memory cells if any. This can prevent any overwriting condition—i.e., unnecessarily increase in the threshold voltage of the memory cell into which data "1" has been written—from taken place due to variation in the manufacturing parameters in a conventional case wherein the writing of data "1" must be completed at a time. It becomes possible to decrease differences among the threshold voltages of the designated memory cells storing the data "1" to be written thereinto. This causes the NAND cell type EEPROM 10 to be much improved in its operational reliability.

Referring now to FIG. 11, a NAND cell type electrically erasable programmable read-only memory or EEPROM in accordance with to another embodiment of this invention is generally designated by a reference numeral "150." NAND cell type EEPROM 150 has a memory array section 152, which is similar in its memory cell matrix configuration to the memory section 12 of the previous embodiment 10 shown in FIGS. 2 and 3.

The memory array section 152 is connected with a row decoder circuit 154 and a column decoder circuit 156. A control-gate controller 158 is connected to the row decoder 154. The control-gate controller 158 is similar in its internal configuration and its function to the controller 14 shown in FIG. 1 and 7. An address buffer section 160 is connected to the decoders 154 and 156. A couple of bit line control circuits 162 and 164 are associated with the memory section 152 and the column decoder 156 as shown in FIG. 11. A substrate voltage control circuit 166 is provided for controlling the voltage of the chip substrate on which the memory section 152 is arranged. An I/O buffer section 168 is connected with the first bit line controller 162.

The embodiment 150 is featured in that the first and second bit line controllers 162 and 164 are provided for the memory array section 152 in such a manner that they are connected respectively to two ends of each of bit lines BL. The first bit line control circuit 162 executes, in a write-verify mode, a sensing operation and a latching operation for a data to be rewritten with respect to all the bit lines BL1, BL2, ..., BLn, independently of the column address designation. In the write-verify mode, the second bit line control circuit 164 also executes a sensing operation and a latching operation for a data to be rewritten with respect to all the bit lines BL1, BL2, ..., BLn, independently of the column addressing. These bit line controllers 162 and 164 operate in a combined manner, as will be described below.

During the verify operation, the data being latched by the first bit line controller 162 is written via a bit line BLi into a selected memory cell transistor Mij in the memory array section. After the data writing was completed, the second bit line controller 164 functions as a sense amplifier for sensing a voltage which appears on the bit line BLi associated with the memory cell transistor Mij. The data voltage sensed by the second bit line controller 164 is utilized as a data rewriting voltage. Thereafter, when the data being latched by the second bit line controller 164 is supplied to the same bit line BLi and then written into the same memory cell transistor Mij, the first bit line controller 162 now serves as a sense amplifier for sensing a voltage corresponding to the actually written data. The alternate latching/sensing operations of the combined bit line controllers 162 and 164 will be repeated until when the write-verifying operation is terminated.

The internal arrangement of the combined bit line controllers 162 and 164 are shown in FIGS. 12A and 12B. The first bit line controller 162 has a CMOS flip-flop circuit that may serve as both a sense amplifier and a data latcher and is constituted by E-type P-channel MOS transistors Qp8 and Qp9 and E-type N-channel MOS transistors Qe15 and Qe16 as shown in FIG. 12B. D-type N-channel MOS transistors Qd12 and Qd13 are provided as capacitors at nodes N1 and N2 respectively. Each of these transistors Qd12 and Qd13 has its source and drain which are connected together. The capacitors are for storing electrical charges representing a data which appears on a bit line during the sensing operation.

E-type N-channel MOS transistors Qe10 and Qe11 are rendered conductive or nonconductive in response to a column select signal CSLj that is selected by the designated column address, thereby to control transmission of data between the input/output lines and the sense-amplifier/data-latcher. E-type N-channel MOS transistors Qe12, Qe13, Qe14 are provided for resetting the above CMOS flip-flop circuit. The MOS transistors Qe12 and Qe13 having their sources connected to a half voltage of the power supply voltage Vcc (Vcc/2) force the flip-flop nodes to reset at the half voltage Vcc/2.

An E-type N-channel MOS transistor Qe17 acts as a transfer gate which selectively connects the flip-flop nodes to a corresponding bit line. E-type N-channel MOS transistors Qe18 and Qe19 constitutes a circuit for supplying the bit lines with electrical charges in accordance with the data contents of the CMOS flip-flop circuit during the write-verify operation. A D-type N-channel MOS transistor Qd14 and an E-type P-channel MOS transistor Qp10 form a circuit for executing a precharging operation for the bit lines in a data read mode. The MOS transistor Qd14 is provided to prevent the intermediate voltage Vppm (about 10 volts), which is applied to the bit lines in a data write mode, from being applied to the MOS transistor Qp10. An E-type N-channel MOS transistor Qe20 and a D-type N-channel MOS transistor Qd15 function to prevent the high voltage Vpp (about 20 volts) to be applied to the bit lines in a data erase mode from being erroneously transferred to the first bit line controller 162. These transistors Qe20 and Qd15 are connected in series with each other, thereby to increase of jack-up the withstanding voltage level thereof.

The second bit line controller 164 shown in FIG. 12A is essentially similar in its circuit configuration to the aforementioned first bit line controller 162. E-type MOS transistors Qe30 and Qe31 may correspond to the transistors Qe12 and Qe13 shown in FIG. 12B; an E-type MOS transistor Qe29 correspond to the transistor Qe14; transistors Qp11 and Qp12 to the transistors Qp8 and Qp9; transistors Qe27 and Qe28 to those Qe15 and Qe16; transistors Qd17 and Qd18 to those Qd12 and Qd13; a transistor Qe26 to the transistor Qe17; a transistor Qe24 to the one Qe19; a transistor Qe25 to the one Qe18; a transistor Qe22 to the one Qe20; and, a transistor Qd16 to the transistor Qd15 shown in FIG. 12B, respectively. An E-type N-channel MOS transistor Qe23 shown in FIG. 12A is provided for resetting the bit lines.

The memory array section 152 is provided between the first and second bit line controllers 162 and 164 as shown in FIG. 11. Each of the bit lines BL running between the first and second controllers 162 and 164 is subdivided into a couple of bit line portions BLa and BLb, as shown in FIG. 12A. The length ratio of the subdivided bit line portions BLa and BLb may be set as represented below:

La:Lb=3:2 where, "La" and "Lb" are the lengths of subdivided bit lines BLa and BLb, respectively. The above subdivision ratio determines the actual level of a bit line precharging voltage in the read mode; for example, the precharging voltage is 3 volts when the power supply voltage Vcc is 5 volts.

Now, the operation modes of the EEPROM 150 will be described hereinafter.

A simultaneous data erase is first carried out for all the memory cells of the EEPROM 150 before a data programming mode is executed. To erase data, a 0-volt voltage is applied to all the control gate lines, i.e., word lines WL. More specifically, in the control circuit shown in FIG. 7, an erase signal ERASE is supplied to the erase/readout controller 116. Responding to the signal, the MOS transistor Qe3 becomes conductive so that a corresponding control gate line WLj is applied with a 0-volt voltage. At this time, the first and second select gate lines SG1 and SG2 are also supplied with the 0-volt voltage. All the bit lines BL and the common source line 80 are set in an electrically floating condition. The high voltage Vpp is then applied to the substrate 30 having its surface in which the memory cell transistors M are formed in a manner as shown in FIG. 3. With such application of high voltage Vpp, a control signal $\overline{ERPH}$ shown in FIGS. 12A and 12B is set at a 0-volt potential level, whereby the high voltage Vpp is prevented from being transferred to the first and second bit line controllers 162 and 164. By maintaining the above state for a suitable length of time period, 10 milliseconds, for instance, electrons are released simultaneously from the floating gate electrodes of all the memory cell transistors.

The threshold voltages of the memory cell transistors are shifted so that the "0" storage condition is given.

When the EEPROM 150 is set in the data write (programming) mode, a data of "one-word" is latched in the sense-amplifier/data-latcher provided in the first bit line controller 162. An input data is transferred from the data input/output buffer 168 to the input/output lines. A column select signal CSLj is selected to have the "H" level, and the input data is then latched in the CMOS flip-flop in the first bit line controller 162. As shown in FIGS. 12A and 12B, signals φpd and φwd are kept at the power supply voltage Vcc until when the data latching is completed. Thereafter, the signals φpd, φwd, FFSD, $\overline{ERPH}$ and φbe are set at the potential level corresponding to the voltage Vppm. The bit lines are supplied with a 0-volt voltage when data "1" is to be written; they are supplied with the voltage Vppm when data "0"! is written.

The high voltage Vpp is applied to a selected word line WLj, while the intermediate voltage Vppm is applied to those of non-selected word lines WL1, WL2, . . . , WL(j−1), which are positioned between the first select gate line SG1 and the selected word line WLj. A write signal WRITE is supplied to the control circuit shown in FIG. 7. Responding to the logical processing between the write signal WRITE and the address signals ai and $\overline{ai}$, one of the high voltage generator 110 and the intermediate voltage generator 112 is rendered operative. As a result, the high voltage Vpp is applied to the selected word line WLj, and the intermediate voltage Vppm is the above-identified non-selected word lines WL1, . . . , Wl(j−1).

The length of time for holding the above biasing condition for the data programming is sufficiently shorter than— preferably 1/100—the normally selected one in the conventional data programming scheme; for example, it is preferably 10 microseconds. Under such a condition, in a memory cell or cells into which data "1" has been written, the threshold voltages thereof are shifted to have a positive value. On the other hand, in the remaining memory cells into which data "0" has been written, the threshold voltages thereof are kept in a negative value.

A write-verify operation is then executed. With this embodiment, verification is made to confirm whether the threshold voltages of the data "1" storing cells increase up to a desirable value. This value may be determined on the basis of the physical data storage characteristic of the memory cell transistors; it is 0.5 volts, for example. The write-verification will be done with respect to each of the memory cells associated with the selected word line WLj.

Figure 13A:
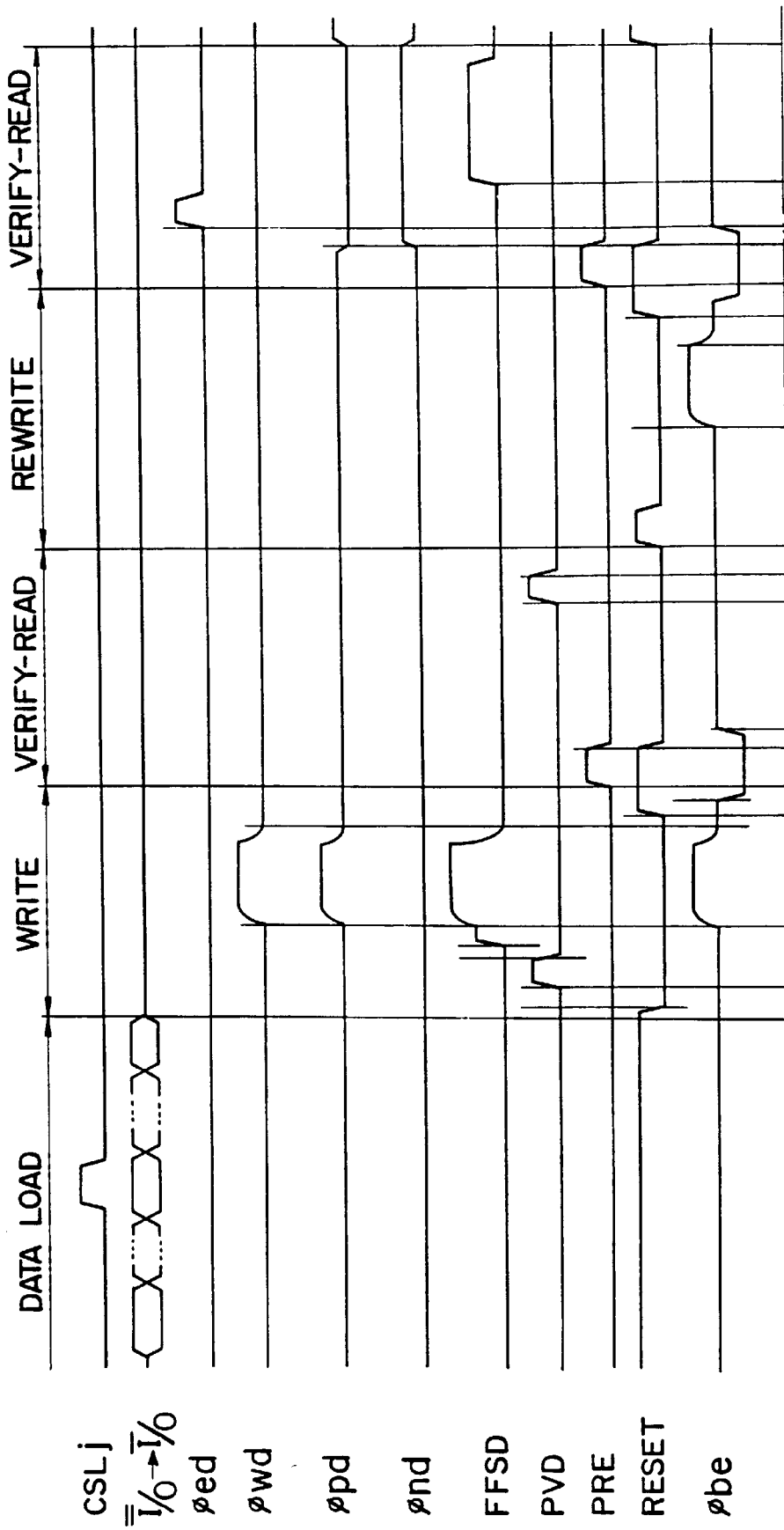
FIGS. 13A and 13B are a diagram showing a timing chart of main signals generated at the main portions of the NAND cell type EEPROM shown in FIG. 11 in a write-verify mode thereof.
Figure 13B:
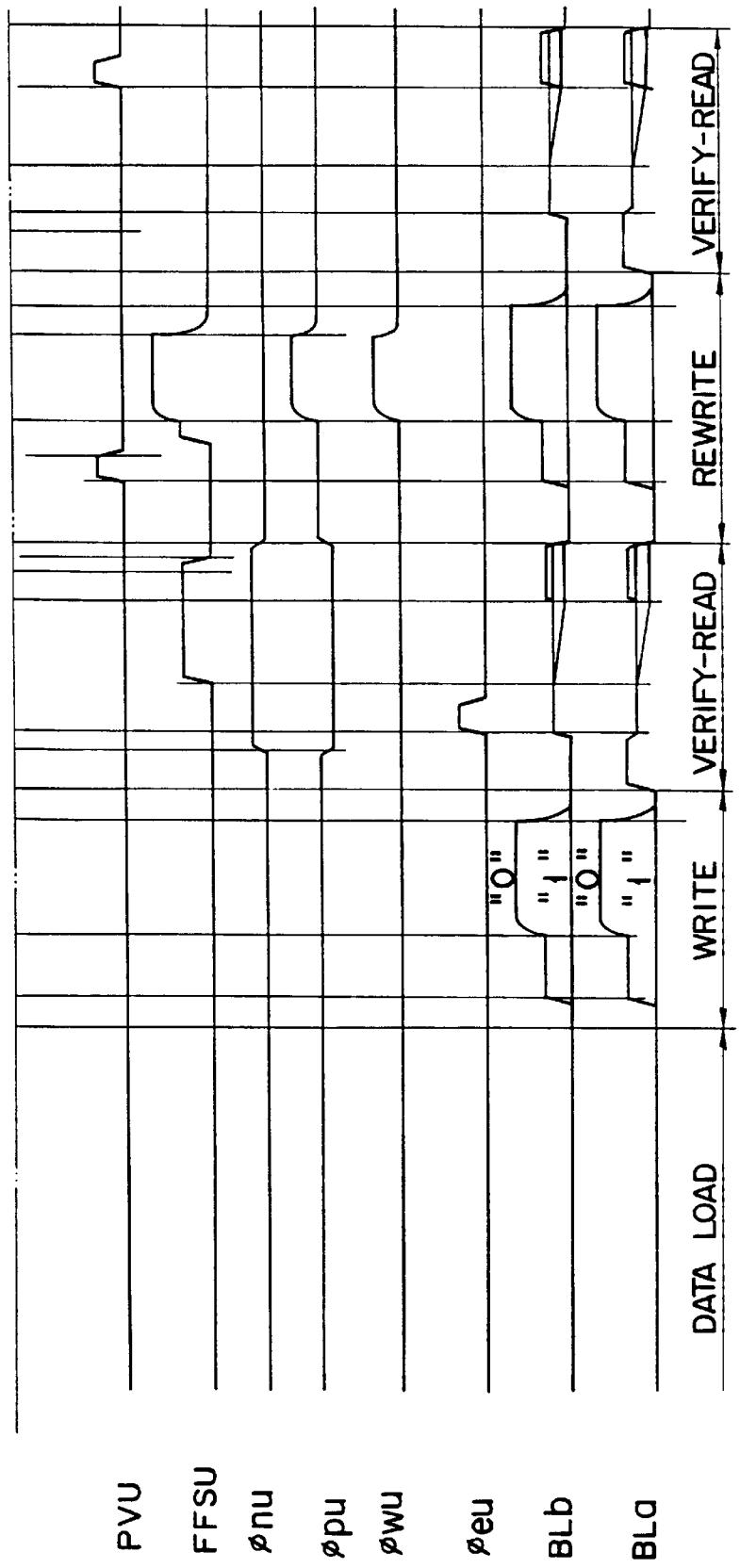

The write-verify operation will be explained in greater detail with reference to FIGS. 13A and 13B, which show the practical timing chart of the main signals generated during the writing and write-verifying operations. Data is sent from the input/output buffer to the data input/output lines I/O and $\overline{I/O}$. In the case of data "1," the I/O line is at the "H" level; In the case of data "0," the I/O line is at the "L" level. When the column select signal CSLj that has been selected in response to address designation is at the "H" level, the data is latched in the MOS flip-flop included in the first bit line controller 162. After latching of one-word data, the reset signal RESET becomes at the "L" level. The bit lines are thus set in the electrically floating condition.

When the signal PVD has the "H" level, the bit lines BL are precharged to a precharge voltage corresponding to the difference between the power supply voltage Vcc and the threshold voltage Vth (Vcc-Vth) in the case of data "0" only. Thereafter, the signal FFSD is set at the "H" level. Those of the bit lines BL that are supplied with data "0" are pre-charged to the voltage Vcc-Vth; the remaining bit lines that are with data "1" are set at 0 volts. The signals φwd, φpd, FFSD, ERPH and φbe are set at the intermediate voltage Vppm. The data "0" supplied bit lines are maintained at the voltage Vppm-Vth, whereas the remaining, data "1" supplied bit lines are set at 0 volts. Under the condition, voltage application to the word lines WL are made in the same manner as described above. The data "0" and "1" may thus be stored in the memory cell transistors arrayed along the selected word line WLj.

Once the data writing is completed, the signals φwd, φpd, φbe become Vcc, and the signal FFSD becomes at 0 volts. The reset signal RESET is at the "H" level, and the bit lines BL are reset to 0 volts.

A verify operation is now executed. First, the signal φbe is at "L" level, so that the bit lines Bla become electrically floating. The signal PRE is changed at the "H" level; the bit line BLa is thus charged to have a voltage equal to the power supply voltage Vcc. Then, the signals PRE and RESET are set at the "L" level, and the signal φbe is at the "H" level. The bit lines BLa and BLb are electrically floating with a certain voltage 3Vcc/5 (3 volts when Vcc is 5 volts). While the signals PRE and RESET are set at the "L" level, the signals φnu and φpu are at Vcc/2 (=2.5 volts).

When the signal φeu is at the "H" level, the voltage potentials at the nodes N3 and N4 of the CMOS flip-flop included in the second bit line controller 164 becomes equal to Vcc/2 (=2.5 volts). Then, the signal φeu is at the "L" level, whereas the signal FFSU is at the "H" level. With such a voltage application, the word lines approach the desired voltage in the same manner as mentioned above. The selected word line WLj is set at the verify voltage Vver; if the actual threshold voltage is less than that value, the voltage on bit line will decrease. This may be summarized as follows: If the threshold voltage of the memory cell(s) in which the data "1" has been written is lower than the verify voltage Vver and the data write condition is not sufficient, the bit line voltage will decrease below the voltage Vcc/2 (=2.5 volts). This requires that data "1" be rewritten in the same memory cell(s). If it is after the data "0" is written, the bit line voltage will obviously decrease. To eliminate unintentional confusion between these voltage decrease phenomenons, the signal PVD is forced to be at the "H" level once after the word line is set at 0 volts. This enables a recharging to be executed only when the data "0" has been latched in the first bit line controller 162. In other words, it is specifically arranged that, only when the threshold voltage of the memory cell(s) is lower than the verify voltage Vver after the data "1" has been written thereinto, the bit line(s) are forced to decrease below the voltage Vcc/2.

At this time, it can be identified in advance whether the voltage at the node N3 is higher than the voltage Vcc/2; the voltage at the node N4 is the voltage Vcc/2. The signal PVD is set at the "L" level, and the signal FFSU is at the "L" level. The nodes N3 and N4 are thus set in an electrically floating condition. Under the condition, by causing the signal φnu to be at 0 volts and simultaneously the signal φpu to be at the voltage Vcc, the difference between the voltage potentials at the nodes N3 and N4 may be sensed. The sensed voltage difference is then latched. This latched voltage will be used as a rewrite data voltage.

As has been described hereinbefore, the first and second bit line controllers 162 and 164 are essentially identical in their circuit configurations with each other; one of the two is basically same in its operation as the other. In this embodiment, a rewriting is first executed in the second bit line controller 164; a write-verification is then performed with the first controller 162. The combination of such rewriting and verifying operations will be repeated, for 128 times, for example, until the all the designated memory cell transistors meet the desirable data write condition.

Figure 14:
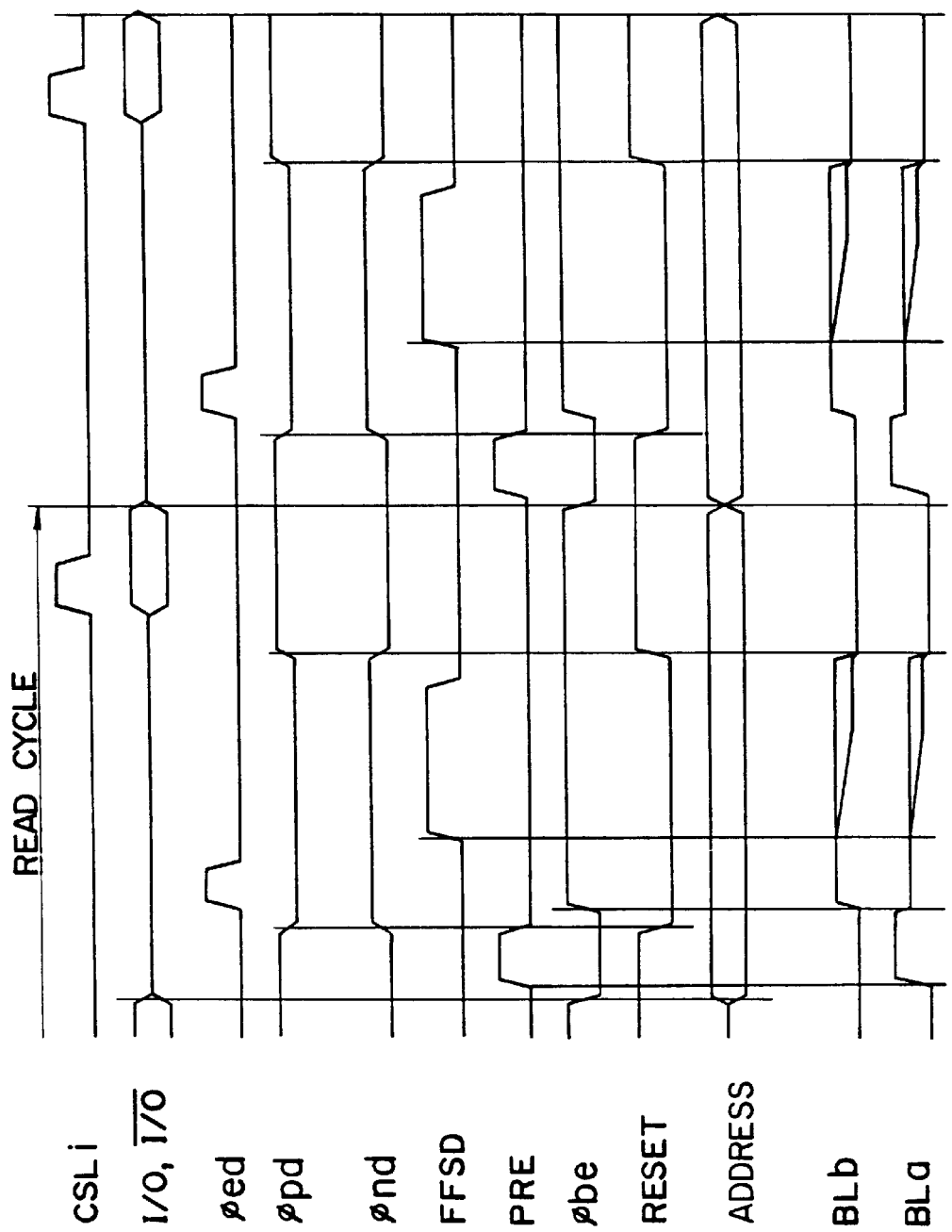
FIG. 14 is a diagram showing a timing chart of main signals generated at the main portions of the NAND cell type EEPROM shown in FIG. 11 in a data read mode of the EEPROM.

FIG. 14 shows a timing chart for a data readout operation of the EEPROM 150. When an address enters, the signal φbe is first changed at the "L" level. The bit line BLa positioned on the side of the first bit line controller 162 becomes electrically floating. Subsequently, the signal PRE is at the "H" level, so that the bit line BLa is precharged to the voltage Vcc. The signals PRE and RESET are set at the "L" level; the signals φpd and φnd are at Vcc/2. When the signal φbe is changed to have the "H" level, the bit lines BLa and BLb are precharged up to 3Vcc/5 (=3 volts). Then, the signal φed is set at the "H" level, and the nodes N1 and N2 on the side of the first bit line controller 162 are equal to Vcc/2. Thereafter, the signal φed is at the "L" level. The signal FFSD changed to have the "H" level; simultaneously, the word lines WL are set in suitable voltage levels as has been already described above. If the storage data is "0," the voltage on a corresponding bit line decreases; if the data is "1,"the bit line voltage is kept unchanged. This bit line voltage is then transferred to the node N1. When the signal FFSD is at the "L" level, the signal φpd equals Vcc, and the signal φnd is 0 volts, a readout data is sensed by the CMOS flip-flop circuit in the first bit line controller 162. When the signal RESET is at the "H" level, the bit line is reset. The column select signal CSLj selected in response to address designation is now changed to have the "H" level. The readout data is sent onto the data input/output lines I/O and $\overline{I/O}$, and then output from the input/output buffer 168 (see FIG. 11).

The following TABLE 3 summaries the aforementioned application of several voltages at the main components of the EEPROM 150 in several operation modes of the same. In Table 3, it is assumed that a word line WL2 is selected during the data writing and write-verifying operations.

TABLE 3

|  | Erase | "1" Write | "0" Write | Write Verify | Read |
|---|---|---|---|---|---|
| Bit Line | Floating | 0 V | 10 V | 3 V | 3 V |
| SG1 | 0 V | 10 V | 10 V | 5 V | 5 V |
| WL1 | 0 V | 10 V | 10 V | 5 V | 5 V |
| WL2 | 0 V | 20 V | 20 V | 0.5 V | 0 V |
| WL3 | 0 V | 10 V | 10 V | 5 V | 5 V |
| WL4 | 0 V | 10 V | 10 V | 5 V | 5 V |
| WL5 | 0 V | 10 V | 10 V | 5 V | 5 V |
| WL6 | 0 V | 10 V | 10 V | 5 V | 5 V |
| WL7 | 0 V | 10 V | 10 V | 5 V | 5 V |
| WL8 | 0 V | 10 V | 10 V | 5 V | 5 V |
| SG2 | 0 V | 0 V | 0 V | 5 V | 5 V |
| Common Source | Floating | 0 V | 0 V | 0 V | 0 V |
| Substrate | 20 V | 0 V | 0 V | 0 V | 0 V |

The present invention is not limited to the above-described specific embodiments and may be practiced or embodied in still other ways without departing from the spirit or essential character thereof. For example, in the above embodiments, a 0.5-volt voltage is used as the verification standard voltage (Vver); such value may be modified to have another value in the practical application for using the write-verifying concept of the present invention. The same thing goes with the writing time length of one cycle: The time length may be further shortened so as to increase the total number of time of executing the combined data-writing and write-verifying operations with fine repeating intervals, whereby compensation for variation in threshold voltages among the designated memory cell transistors can be made at higher precision. In addition, the write-verify concept of the present invention may also to applied, other than the NAND cell type EEPROMs utilizing the tunneling effect for carrier movement between the substrate and the floating gate electrodes as in the above embodiments, to those which utilize the hot-electron injection or the like.

What is claimed is:

1. A method for programming a non-volatile semiconductor memory device including a plurality of memory cells, a word line a, plurality of bit lines, and a plurality of data latch circuits, in which said plurality of memory cells are coupled to the word line and are coupled to said plurality of data latch circuits through said plurality of bit lines, the method comprising the following steps of:

storing data of a first logic level or a second logic level into said plurality of data latch circuits;

applying a programming voltage to said word line;

applying a first level voltage corresponding to the first logic level or a second level voltage corresponding to the second logic level to said bit lines in accordance with the level of the data stored in said plurality of data latch circuits, wherein said first level voltage promotes programming of the memory cell and said second level voltage maintains a memory state of any memory cell which has been programmed;

sensing a memory state of one or more given memory cells coupled to respective given data latch circuits in which the data of the first logic level is stored and verifying successful programming of each said one or more given memory cell based on the sensed memory state of said one or more given memory cells;

modifying the level of the data stored in said given data latch circuit or circuits, from the first logic level to the second logic level upon verification of successful programming of said given memory cell; and stopping application of the programming voltage to said word line if data stored in all of said plurality of data latch circuits are the second logic level.

2. A method according to claim 1, wherein said programming voltage applying step comprises applying a programming voltage which is higher than said first level voltage and said second level voltage.

3. A method according to claim 1, wherein said first level voltage or second level voltage applying step comprises applying the first level voltage which changes a threshold voltage of the corresponding memory cell for programming.

4. A method for programming a nonvolatile semiconductor memory device including a plurality of memory cells, comprising the following steps of:

storing control data which defines whether or not write voltages are to be applied to respective of said memory cells;

selectively applying said write voltages to a part of said memory cells, which part is selected according to the stored control data;

determining actual written states of said memory cells; and selectively modifying said stored control data based on a predetermined logical relationship between the determined actual written states of said memory cells and the stored control data, thereby applying said write voltages only to memory cells which are not sufficiently written to achieve a predetermined written state.

5. The method according to claim 4, further comprising a step of initially setting initial control data of said control data stored, and a step of modifying said initial control data in accordance with said predetermined logical relationship.

6. The method according to claim 5, wherein said initially setting step comprises a step of setting control data through at least one input line.

7. The method according to claim 4, wherein said actual written states of said memory cells are simultaneously determined.

8. The method according to claim 4, wherein a selectively modifying step comprises simultaneously modifying control data stored in said plurality of programming circuits in accordance with said predetermined logical relationship.

9. The method according to claim 4, further comprising selectively changing voltages applied to said memory cells according to said stored control data.

10. The method according to claim 9, further comprising selectively and simultaneously changing said voltages of said bit lines applied to said memory cells.

11. The a method according to claim 4, wherein said selectively modifying step is continued until each memory cell is sufficiently written.

12. The method according to claim 4, wherein said modifying and applying step is repeated during a limited number of cycles.

13. A method for simultaneously programming non-volatile semiconductor memory cells, said memory cells being coupled to a word line and respective bit lines, based on data stored in a plurality of data latch circuits, each data latch circuit being coupled to respective one of said bit lines, comprising the steps of:

(a) storing data of first and second logic levels in said data latch circuits;

(b) applying a programming voltage to said word line;

(c) applying a first level voltage to the bit lines corresponding to data latch circuits storing said first logic level, wherein said first level voltage promotes programming of the memory cell;

(d) applying a second level voltage to the bit lines corresponding to data latch circuits storing said second logic level, wherein said second level voltage maintains a memory state of the memory cell;

(e) sensing the memory states of the memory cells corresponding to data latch circuits storing said first logic level and verifying successful programming based on the sensed memory states;

(f) modifying stored data from said first logic level to said second logic level in the data latch circuits corresponding to memory cells in which successful programming has been sensed;

(g) maintaining stored data at said first logic level in the data latch circuits corresponding to memory cells in which successful programming has not been sensed; and (h) maintaining stored data at said second logic level in the data latch circuits storing said second logic level.

14. The method for simultaneously programming non-volatile semiconductor memory cells according to claim 13, further comprising the step of:

detecting whether or not all of data stored in said data latch circuits have become said second logic level.

15. The method for simultaneously programming non-volatile semiconductor memory cells according to claim 14, further comprising the step of:

stopping application of said programming voltage to said word line if it has been detected that all of data stored in said data latch circuit have become said second logic level.

16. The method for simultaneously programming non-volatile semiconductor memory cells according to claim 13, wherein said programming voltage is higher than said first level voltage and said second level voltage.

17. The method for simultaneously programming non-volatile semiconductor memory cells according to claim 13, wherein the memory cell is an EEPROM cell having a floating gate, a control gate, a drain terminal and a source terminal, said control gate being coupled to the word line and said drain terminal being coupled to the bit line.

18. A method for programming a non-volatile semiconductor device including a plurality of memory cells for storing input data applied to said non-volatile semiconductor device, comprising the steps of:

storing first or second control data defining a programming state in association with each of said memory cells;

selecting one or more memory cells for programming to store applied input data;

applying programming voltages to one or more given memory cells of the selected memory cells in dependence on whether said first control data is stored in association with the selected memory cells, wherein said first control data promotes memory cell programming and the second control data maintains a memory state;

determining whether the one or more given memory cells to which programming voltages are applied are successfully programmed or not upon application of said programming voltages thereto;

modifying to second control data the first control data stored in association with given memory cells which are determined to have been successfully programmed in said determining step;

maintaining said first control data stored in association with those of said given memory cells which are determined to have been unsuccessfully programmed in said determining step; and maintaining said stored second control data associated with any others of said memory cells.

19. The method according to claim 18, further comprising:

stopping application of programming voltages to each memory cell having said second control data stored in association therewith.

* * * * *

UNITED STATES PATENT AND TRADEMARK OFFICE
CERTIFICATE OF CORRECTION

PATENT NO. : 5,831,903
DATED : November 3, 1998
INVENTOR(S) : Kazunori OHUCHI et al.

It is certified that error appears in the above-identified patent and that said Letters Patent is hereby corrected as shown below:

On the title page, item [*], the Terminal Disclaimer information should read:

--The term of this patent shall not extend beyond the expiration date of Pat. No. 5,357,462.--

Signed and Sealed this

Seventeenth Day of August, 1999

Attest:

Q. TODD DICKINSON

Attesting Officer

Acting Commissioner of Patents and Trademarks